(12) United States Patent
Hayasi

(10) Patent No.: US 6,706,967 B2
(45) Date of Patent: Mar. 16, 2004

(54) LEAD-LESS SEMICONDUCTOR DEVICE WITH IMPROVED ELECTRODE PATTERN STRUCTURE

(75) Inventor: Kouzi Hayasi, Tokyo (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 0 days.

(21) Appl. No.: 10/427,943

(22) Filed: May 2, 2003

(65) Prior Publication Data
US 2003/0201113 A1 Oct. 30, 2003

Related U.S. Application Data

(62) Division of application No. 09/840,141, filed on Apr. 24, 2001, now abandoned.

(30) Foreign Application Priority Data

Apr. 24, 2000 (JP) ........................................ 2000-122643

(51) Int. Cl.$^7$ ............................ H05K 5/06; H01L 23/02
(52) U.S. Cl. .................... 174/52.2; 174/52.4; 257/698; 257/787
(58) Field of Search ............................. 174/52.2, 52.4; 257/690, 692, 698, 787

(56) References Cited

U.S. PATENT DOCUMENTS

| 5,872,338 A | 2/1999 | Lan et al. |
| 6,249,024 B1 | 6/2001 | Mangtani |
| 6,337,521 B1 * | 1/2002 | Masuda ...................... 257/777 |
| 6,372,553 B1 | 4/2002 | Briar |

* cited by examiner

Primary Examiner—Hung V. Ngo
(74) Attorney, Agent, or Firm—Young & Thompson

(57) ABSTRACT

A semiconductor device includes an insulating substrate having a first main face which is sealed with a sealing material and at least a set of input and output electrode patterns provided on the first main face. The input and output electrode patterns are separated from each other. The device also includes at least a ground electrode pattern having a ground potential. The ground electrode pattern is separated from the input and output electrode patterns. The device further includes at least an electrically conductive pattern extending over an inter-region between the input and output electrode patterns. The electrically conductive pattern is separated from the input and output electrode patterns, and the electrically conductive pattern is electrically connected to the ground electrode pattern, so that the electrically conductive pattern has a ground potential.

3 Claims, 47 Drawing Sheets h : 250～290μm
w : 250～290μm
t2 : 120～140μm

LEAD-LESS SEMICONDUCTOR DEVICE WITH IMPROVED ELECTRODE PATTERN STRUCTURE

This application is a division of application Ser. No. 09/840,141, filed on Apr. 24, 2001, now abandoned the entire contents of which are hereby incorporated by reference.

BACKGROUND OF THE INVENTION

1. Field of the Invention

The present invention relates to a semiconductor device, and more particularly to a lead-less semiconductor device having a mounting substrate for mounting a chip, wherein the mounting substrate comprises a ceramic base with a surface, which has electrodes with improved-shapes thereon.

2. Description of the Related Art

FIG. 1A is a plan view of a first main face of a mounting substrate, wherein a bipolar transistor chip is bonded by metal wire-bonding. FIG. 1B is a plan view of a second main face of the mounting substrate of FIG. 1A. FIG. 1C is a cross sectional elevation view of a semiconductor device having the substrate of FIGS. 1A and 1B, taken along an X1–X1' line in FIG. 1A. FIG. 1D is a cross sectional elevation view of a semiconductor device having the substrate of FIGS. 1A and 1B, taken along a Y1–Y1' line in FIG. 1A. FIG. 1E is a plan view of electrodes on the first main face of the mounting substrate of FIG. 1A. FIG. 1F is a plan view of electrodes on the second main face of the mounting substrate of FIG. 1B. FIG. 1G is a cross sectional elevation view of the electrodes on the first and second main faces of the substrate of FIGS. 1E and 1F, taken along an X2–X2' line in FIG. 1E. FIG. 1H is a cross sectional elevation view of the electrodes on the first and second main faces of the substrate of FIGS. 1E and 1F, taken along a Y2–Y2' line in FIG. 1E.

With reference to FIGS. 1A through 1H, a semiconductor device 900 has a mounting substrate 910 and a sealing resin 7. The mounting substrate 910 has a first main face which is adjacent to the sealing resin 7 and a second main face which is positioned opposite to the first main face. On the first main face, a chip mounting electrode 920 is provided for mounting a semiconductor chip 20, and also first and second pad electrodes 930 and 940. On the second main face, first, second and third terminal electrodes 924, 934 and 944 are provided for external connections. The first terminal electrode 924 is connected through first and second via holes 921 and 922 to the chip mounting electrode 920. The second terminal electrode 934 is connected through a third via hole 931 to the first pad electrode 934. The third terminal electrode 944 is connected through a fourth via hole 941 to the second pad electrode 944. The semiconductor chip 20 has a first electrode 21 connected through a first metal bonding wire 8-1 and a second electrode 22 connected through a second metal bonding wire 8-2.

Respective sizes in FIG. 1E are assumed as follows. c1=1 mm. c2=0.5 mm. c3=0.1 mm. c4=0.325 mm. d1=0.5 mm. d2=0.45 mm. d3=d4=d5=0.15 mm. An estimated capacitance between the chip mounting electrode 920 and the first pad electrode 930 is then Ccbpkgx=60 fF. The characteristics of the transistor chip 20 are assumed as follows. A base resistance: Rb=14 ohms. A current gain cut-off frequency fT=16 GHz. A collector-base capacitance: Ccbchip=150 fF. If an emitter of the transistor chip is grounded, a maxim power gain Gmax at a frequency of 2 GHz is given by Gmax=[1/{8 πRb(Ccbchip+Ccbpkgx)}]×(f/fT)=17.3 dB.

Since no electrically conductive pattern is provided between the chip mounting electrode 920 and the first pad electrode 930, the estimated capacitance Ccbpkgx between the chip mounting electrode 920 and the first pad electrode 930 is large, resulting in a large feed-back capacitance between input and output terminals and a reduced gain of the transistor chip.

In the above circumstances, it had been required to develop a novel lead-less semiconductor device free from the above problem.

SUMMARY OF THE INVENTION

Accordingly, it is an object of the present invention to provide a novel lead-less semiconductor device having a mounting substrate made of a ceramic-based material free from the above problems.

It is a further object of the present invention to provide a novel lead-less semiconductor device having electrode patterns of improved shapes for obtaining a reduced feed-back capacitance between input and output terminals.

It is a still further object of the present invention to provide a novel lead-less semiconductor device having electrode patterns of improved shapes for ensuring high maximum gain and suppressing any interference between input and output terminals.

The present invention provides a semiconductor device comprising: an insulating substrate have a first main face which is sealed with a sealing material; at least a set of input and output electrode patterns provided on the first main face, and the input and output electrode patterns being separated from each other; at least a ground electrode pattern having a ground potential, and the ground electrode pattern being separated from the input and output electrode patterns; and at least an electrically conductive pattern extending over an inter-region between the input and output electrode patterns, and the electrically conductive pattern being separated from the input and output electrode patterns, and the electrically conductive pattern being electrically connected to the ground electrode pattern, so that the electrically conductive pattern has a ground potential.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION

Figure 1A:
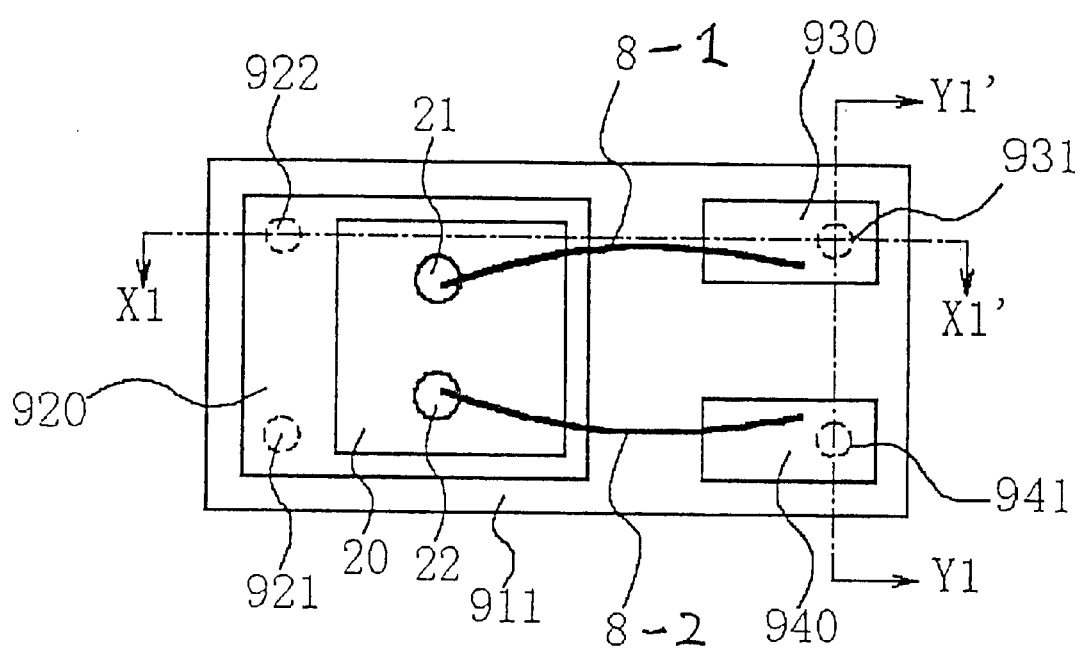
FIG. 1A is a plan view of a first main face of a mounting substrate, wherein a bipolar transistor chip is bonded by metal wire-bonding.
Figure 1B:
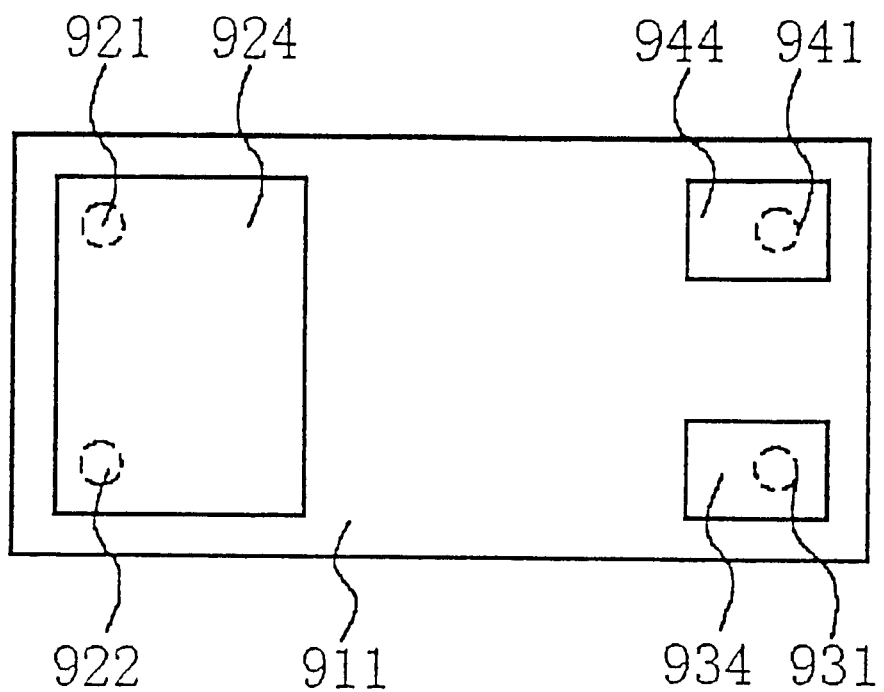
FIG. 1B is a plan view of a second main face of the mounting substrate of FIG. 1A.
Figure 1C:
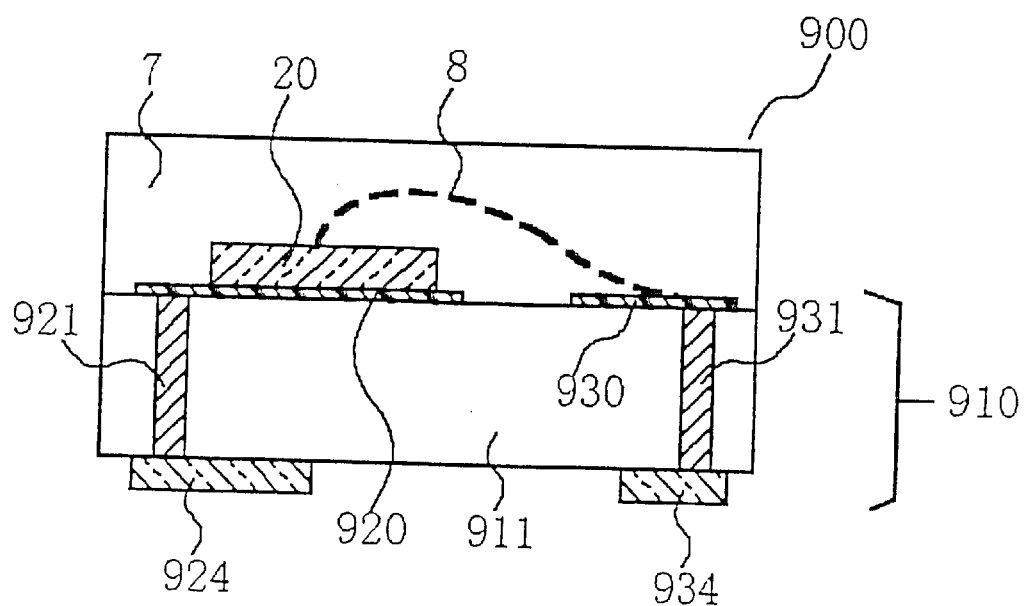
FIG. 1C is a c ross sectional elevation view of a semiconductor device having the substrate of FIGS. 1A and 1B, taken a long an X1–X1' line in FIG. 1A.
Figure 1D:
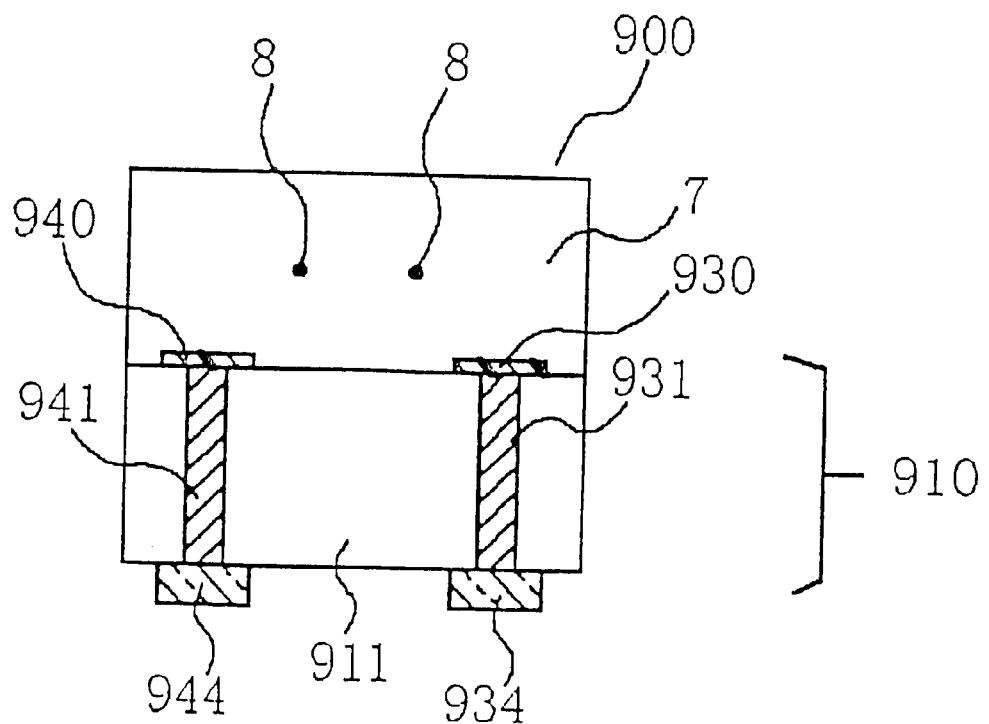
FIG. 1D is a cross sectional elevation view of a semiconductor device having the substrate of FIGS. 1A and 1B, taken along a Y1–Y1 ' line in FIG. 1A.
Figure 1E:
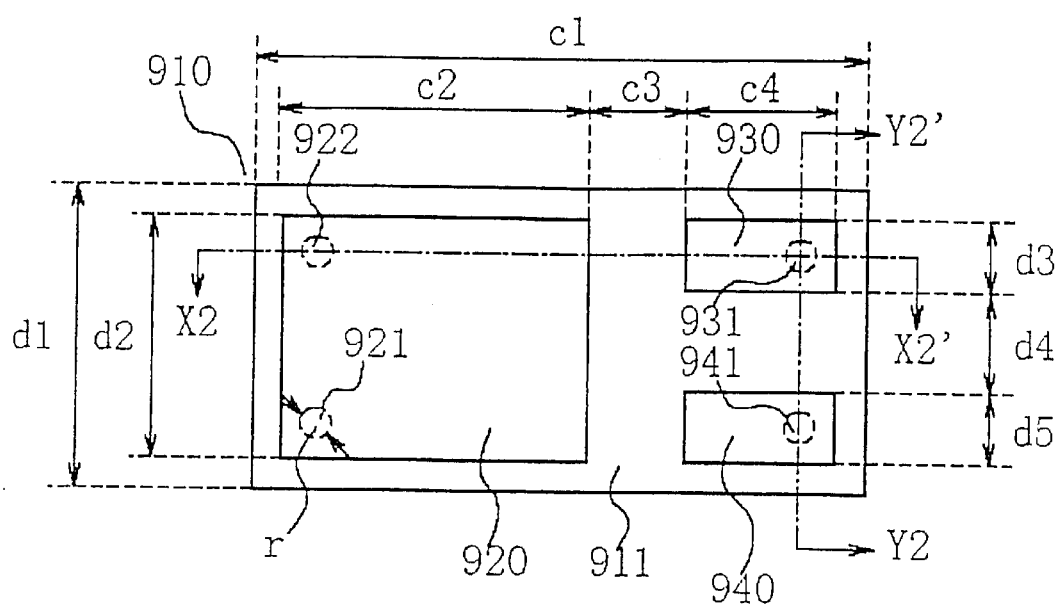
FIG. 1E is a plan view of electrodes on the first main face of the mounting substrate of FIG. 1A.
Figure 1F:
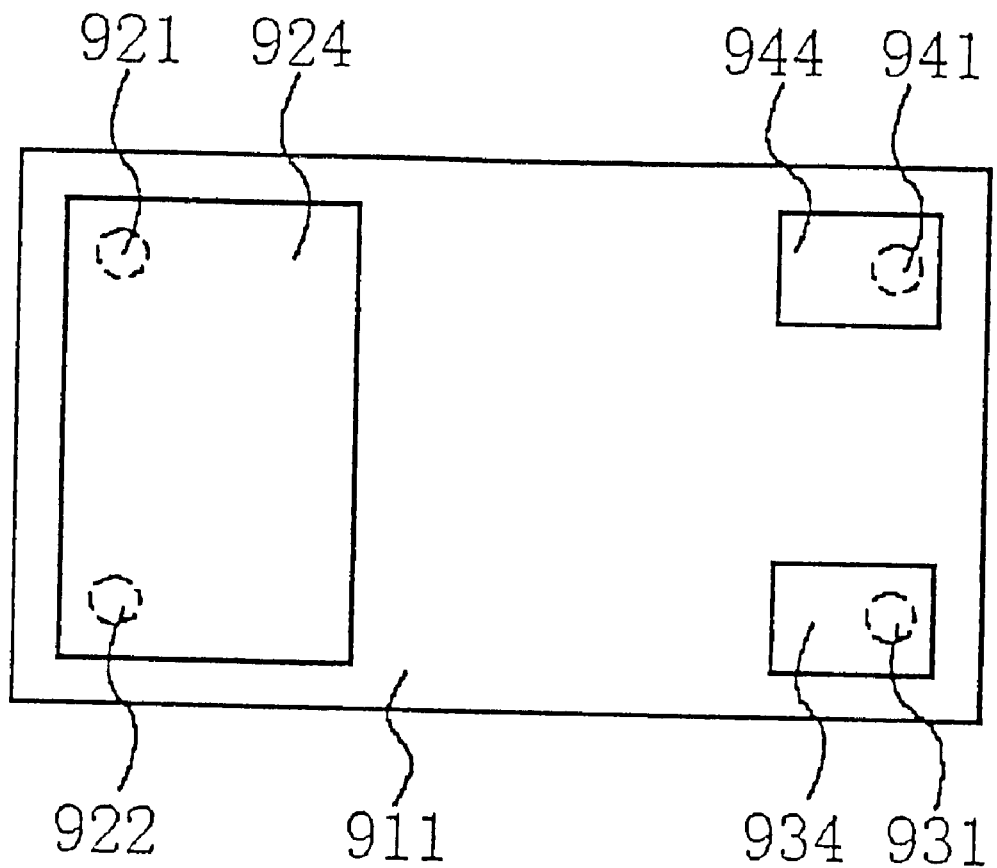
FIG. 1F is a plan view of electrodes on the second main face of the mounting substrate of FIG. 1B.
Figure 1G:
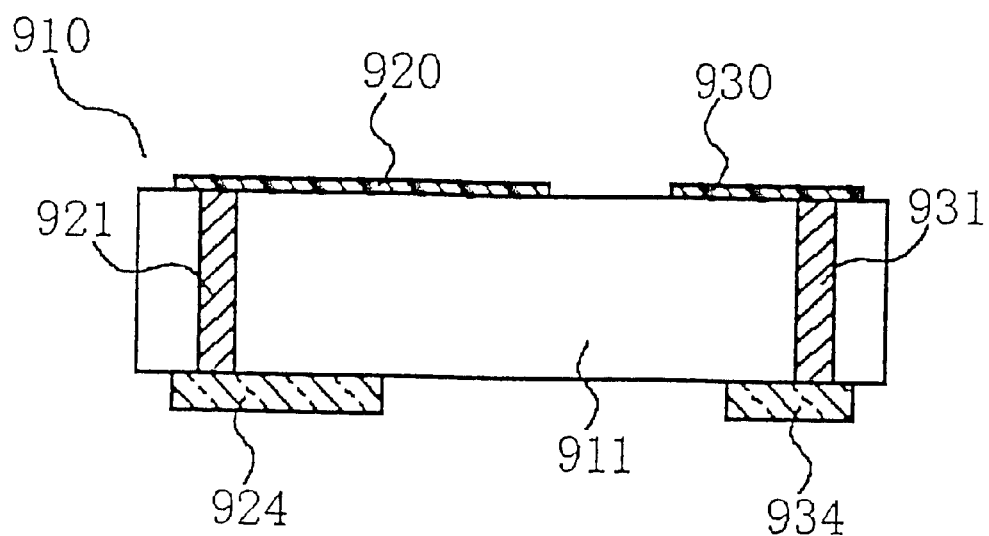
FIG. 1G is a cross sectional elevation view of the electrodes on the first and second main faces of the substrate of FIGS. 1E and 1F, taken along an X2–X2' line in FIG. 1E.
Figure 1H:
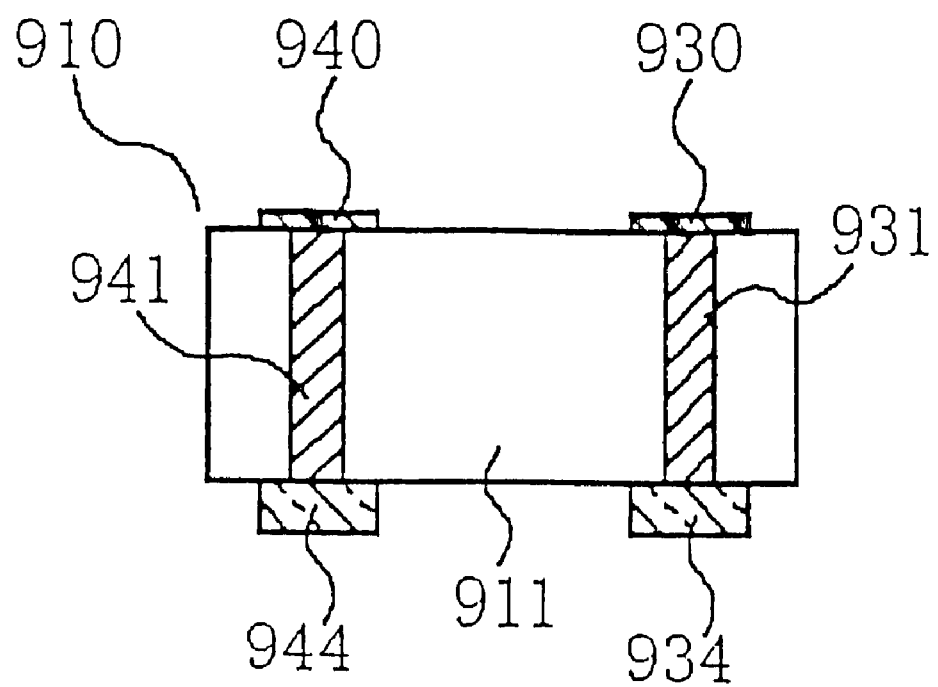
FIG. 1H is a cross sectional elevation view of the electrodes on the first and second main faces of the substrate of FIGS. 1E and 1F, taken along a Y2–Y2' line in FIG. 1E.

A first aspect of the present invention is a semiconductor device comprising: an insulating substrate have a first main face which is sealed with a sealing material; at least a set of input and output electrode patterns provided on the first main face, and the input and output electrode patterns being separated from each other; at least a ground electrode pattern having a ground potential, and the ground electrode pattern being separated from the input and output electrode patterns; and at least an electrically conductive pattern extending over an inter-region between the input and output electrode patterns, and the electrically conductive pattern being separated from the input and output electrode patterns, and the electrically conductive pattern being electrically connected to the ground electrode pattern, so that the electrically conductive pattern has a ground potential.

The electrically conductive pattern has the ground potential and is provided between the input and output electrode patterns. The electrically conductive pattern reduces a capacitance between the input and output electrode patterns.

It is preferable that the electrically conductive pattern extends from the ground electrode pattern, so that the electrically conductive pattern is unitary formed with the ground electrode pattern.

It is also preferable that one of the ground electrode pattern is provided for a single set of the input and output electrode patterns, and the electrically conductive pattern extends from the one ground electrode pattern.

It is also preferable that a plurality of the ground electrode pattern is provided for a single set of the input and output electrode patterns, and the electrically conductive pattern extends from one of the plural ground electrode patterns.

It is also preferable that each of the plural ground electrode patterns is provided for each of plural sets of the input and output electrode patterns, and each of the plural electrically conductive patterns extends from each of the plural ground electrode patterns.

It is also preferable that a plurality of the ground electrode pattern is provided for each of plural sets of the input and output electrode patterns, and the electrically conductive pattern extends from one of the plural ground electrode patterns for each set of the input and output electrode patterns.

It is also preferable to further comprise: a plurality of through holes filled with an electrically conductive material, and the through holes being in contact with the electrically conductive pattern and being positioned between via holes connected with the input and output electrode patterns. The through holes between the via holes connected with the input and output electrode patterns reduce interference between the input and output electrode patterns.

It is also preferable that one of the input and output electrode patterns comprises a chip mounting electrode, on which a semiconductor chip is mounted.

It is also preferable that the ground electrode pattern comprises a chip mounting electrode, on which a semiconductor chip is mounted.

It is also preferable that the insulating substrate comprises a ceramic base substrate.

A second aspect of the present invention is a semiconductor device comprising: an insulating substrate have a first main face which is sealed with a sealing material; at least a set of input and output electrode patterns provided on the first main face, and the input and output electrode patterns being separated from each other; at least a ground electrode pattern having a ground potential, and the ground electrode pattern being provided on an inter-region between the input and output electrode patterns and separated from the input and output electrode patterns; and a semiconductor chip mounted on the ground electrode pattern.

The ground electrode pattern for mounting the semiconductor chip has the ground potential and is provided between the input and output electrode patterns. The ground electrode pattern reduces a capacitance between the input and output electrode patterns.

It is p referable that the semiconductor chip has a first terminal connected to the input electrode pattern, a second terminal connected to the output electrode pattern, and a third terminal connected to an extending pattern which extends from the ground electrode pattern.

It is also preferable that the insulating substrate comprises a ceramic base substrate.

A third aspect of the present invention is an electrode pattern structure on a first main face of an insulating substrate. The structure comprising: at least a set of input and output electrode patterns being separated from each other; at least a ground electrode pattern having a ground potential and being separated from the input and output electrode patterns; and at least an electrically conductive pattern extending over an inter-region between the input and output electrode patterns, and the electrically conductive pattern being separated from the input and output electrode patterns, and the electrically conductive pattern being electrically connected to the ground electrode pattern, so that the electrically conductive pattern has a ground potential.

This third aspect of the present invention has the same characteristics described above in connection with the first aspect of the present invention.

A fourth aspect of the present invention is an electrode pattern structure on a first main face of an insulating substrate. The structure comprises: at least a set of input and output electrode patterns being separated from each other; and at least a ground electrode pattern having a ground potential, and the ground electrode pattern being provided on an inter-region between the input and output electrode patterns and separated from the input and output electrode patterns.

This fourth aspect of the present invention has the same characteristics described above in connection with the second aspect of the present invention.

PREFERRED EMBODIMENTS

First Embodiment

Figure 2A:
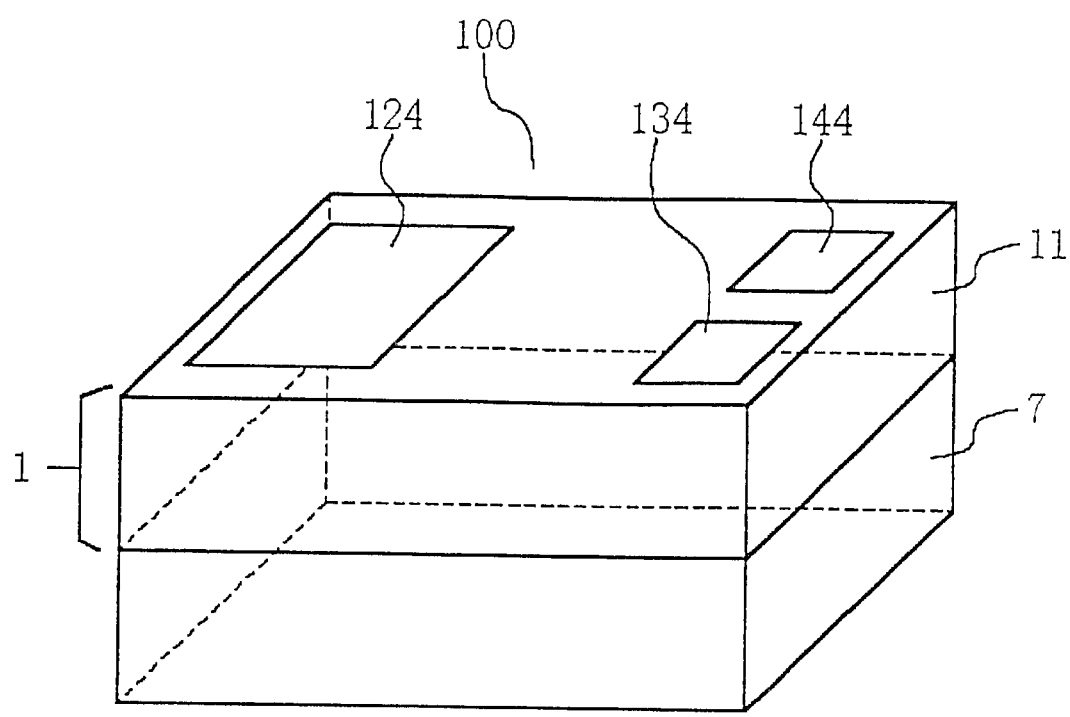
FIG. 2A is a schematic perspective view of a lead-less semiconductor device in a first embodiment in accordance with the present invention.
Figure 2B:
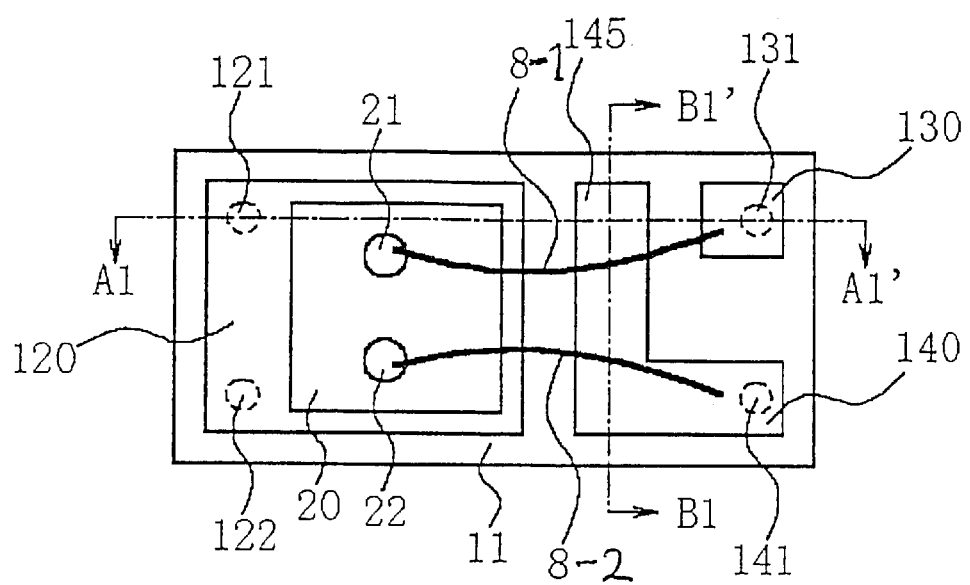
FIG. 2B is a plan view of a first main face of a mounting substrate of the lead-less semiconductor device of FIG. 2A.
Figure 2C:
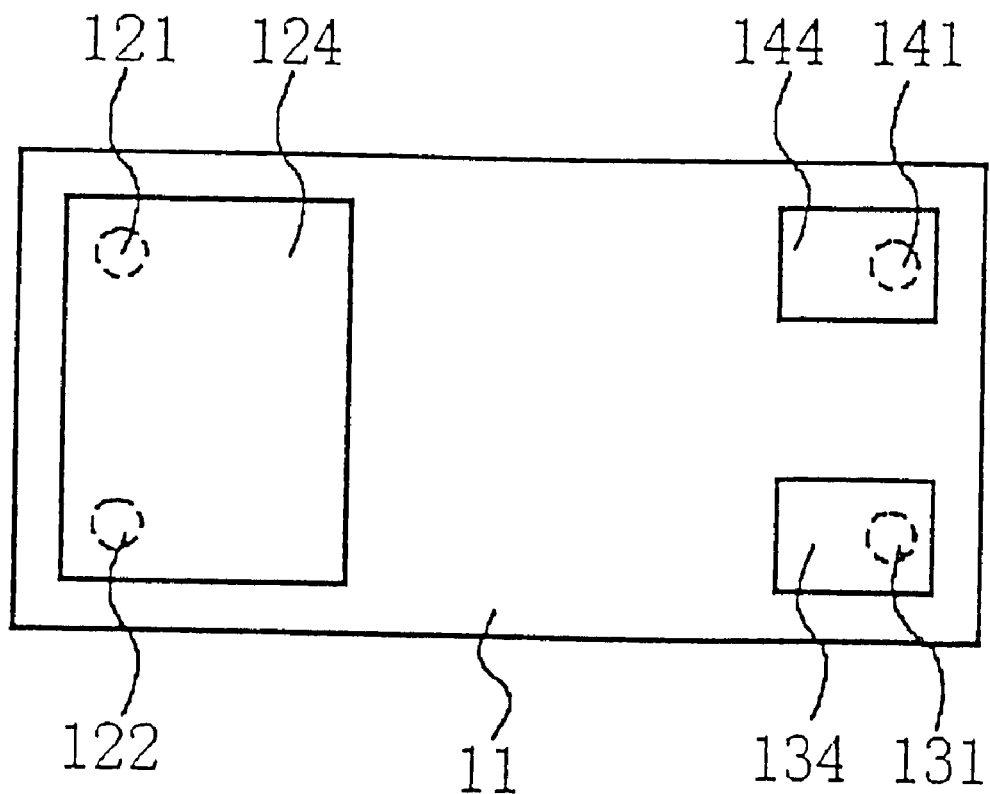
FIG. 2C is a plan view of a second main face of the mounting substrate of the lead-less semiconductor device of FIG. 2A.
Figure 2D:
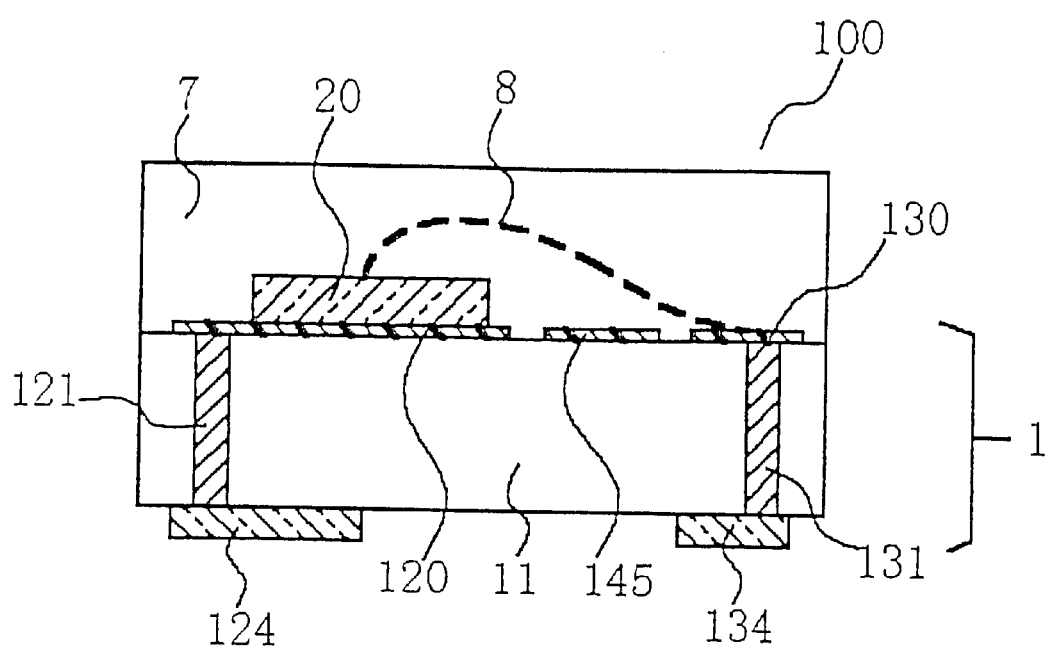
FIG. 2D is a cross sectional elevation view of the lead-less semiconductor device of FIG. 2A, taken along an A1–A1' line in FIG. 2B.
Figure 2E:
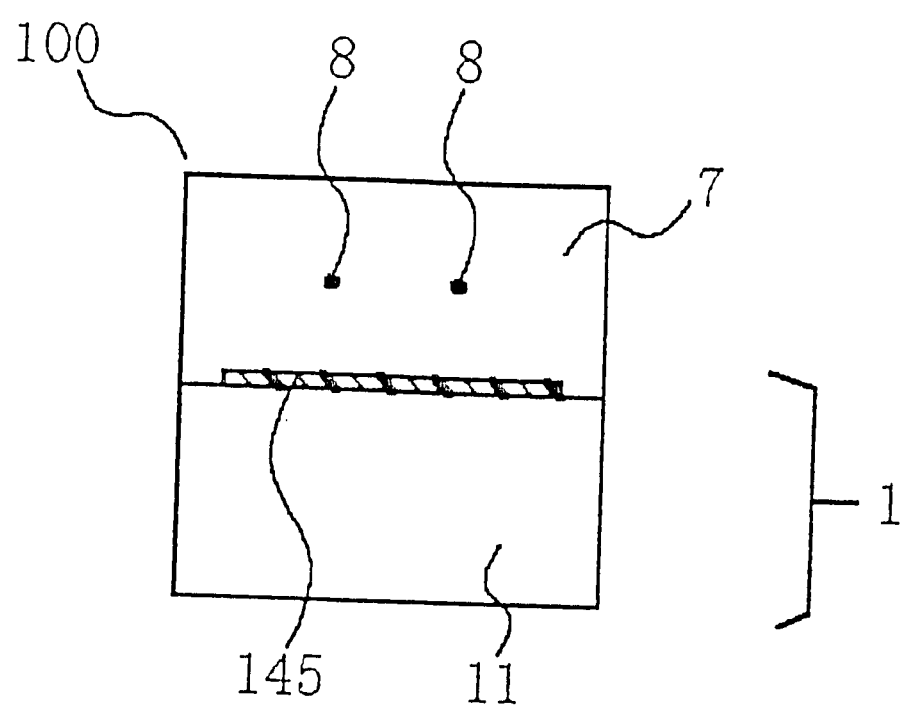
FIG. 2E is a cross sectional elevation view of the lead-less semiconductor device of FIG. 2A, taken along a B1–B1' line in FIG. 2B.
Figure 2F:
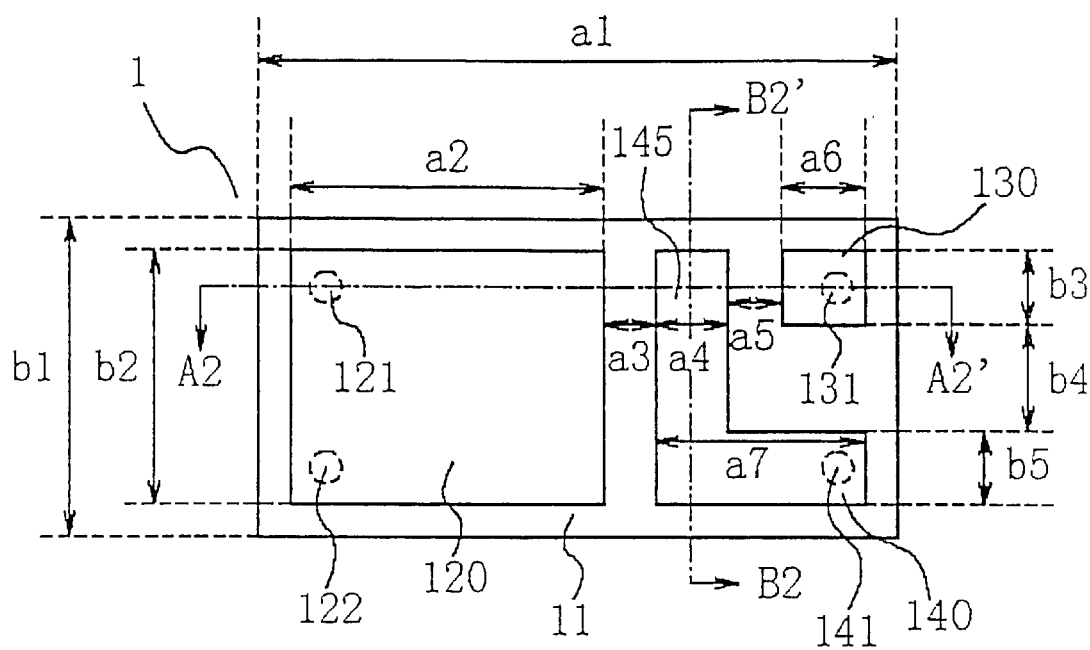
FIG. 2F is a plan view of electrodes on the first main face of the mounting substrate of FIG. 2B.
Figure 2G:
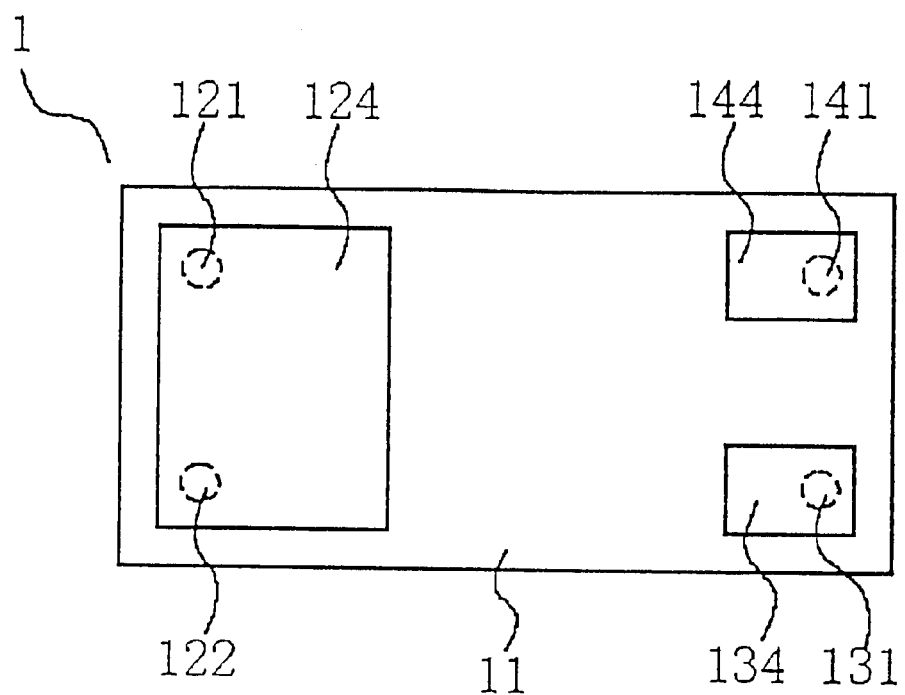
FIG. 2G is a plan view of electrodes on the second main face of the mounting substrate of FIG. 2C.
Figure 2H:
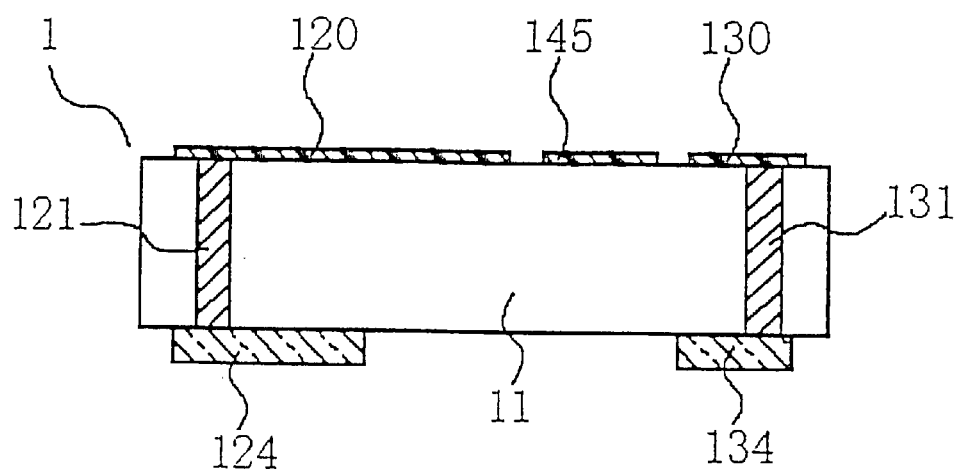
FIG. 2H is a cross sectional elevation view of the electrodes on the first and second main faces of the substrate of FIGS. 2F and 2G, taken along an A2–A2' line in FIG. 2F.
Figure 2I:
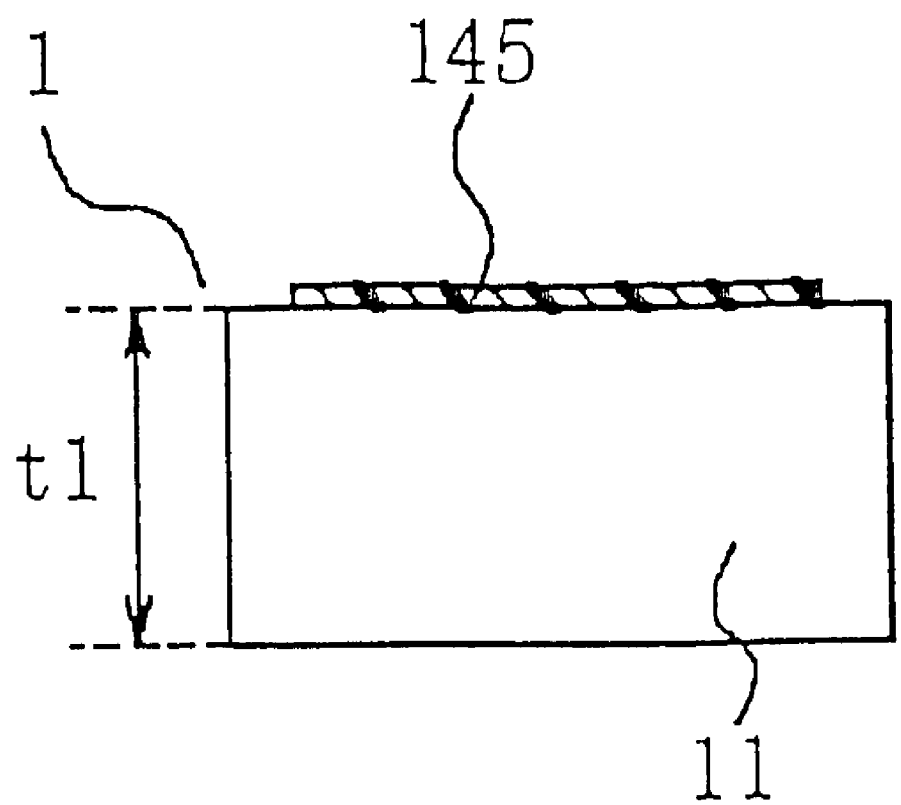
FIG. 2I is a cross sectional elevation view of the electrodes on the first and second main faces of the substrate of FIGS. 2F and 2G, taken along a B2–B2' line in FIG. 2F.
Figure 3:
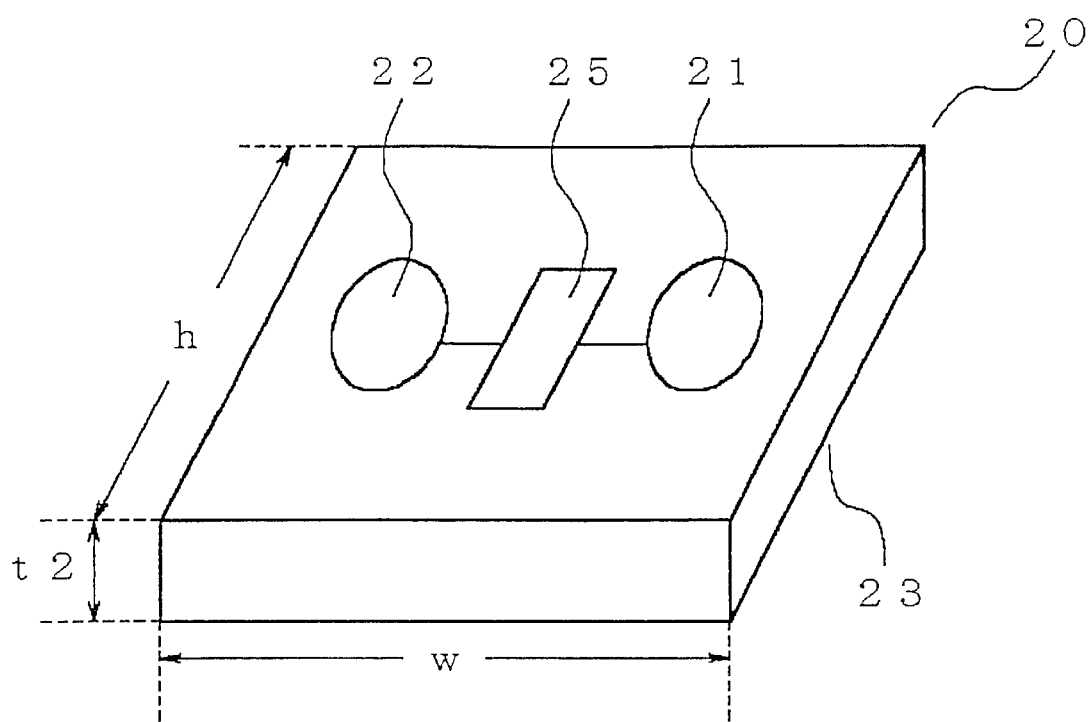
FIG. 3 is a schematic perspective view of a semiconductor chip to be used for the semiconductor device in a first embodiment in accordance with the present invention.

A first embodiment according to the present invention will be described in detail with reference to the drawings. FIG. 2A is a schematic perspective view of a lead-less semiconductor device in a first embodiment in accordance with the present invention. FIG. 2B is a plan view of a first main face of a mounting substrate of the lead-less semiconductor device of FIG. 2A. FIG. 2C is a plan view of a second main face of the mounting substrate of the lead-less semiconductor device of FIG. 2A. FIG. 2D is a cross sectional elevation view of the lead-less semiconductor device of FIG. 2A, taken along an A1–A1' line in FIG. 2B. FIG. 2E is a cross sectional elevation view of the lead-less semiconductor device of FIG. 2A, taken along a B1–B1' line in FIG. 2B. FIG. 2F is a plan view of electrodes on the first main face of the mounting substrate of FIG. 2B. FIG. 2G is a plan view of electrodes on the second main face of the mounting substrate of FIG. 2C. FIG. 2H is a cross sectional elevation view of the electrodes on the first and second main faces of the substrate of FIGS. 2F and 2G, taken along an A2–A2' line in FIG. 2F. FIG. 2I is a cross sectional elevation view of the electrodes on the first and second main faces of the substrate of FIGS. 2F and 2G, taken along a B2–B2' line in FIG. 2F. FIG. 3 is a schematic perspective view of a semiconductor chip to be used for the semiconductor device in a first embodiment in accordance with the present invention.

With reference to FIGS. 2A through 2I, a semiconductor device 100 has a mounting substrate 1 and a sealing resin 7. The mounting substrate 1 has a first main face which is adjacent to the sealing resin 7 and a second main face which is positioned opposite to the first main face. The mounting substrate 1 comprises a ceramic-base 11. On the first main face, a chip mounting electrode 120 is provided for mounting a semiconductor chip 20, and also first and second pad electrodes 130 and 140.

On the second main face, first, second and third terminal electrodes 124, 134 and 144 are provided for external connections. The first terminal electrode 124 is connected through first and second via holes 121 and 122 to the chip mounting electrode 120. The second terminal electrode 134 is connected through a third via hole 131 to the first pad electrode 130. The third terminal electrode 144 is connected through a fourth via hole 141 to the second pad electrode 140. The semiconductor chip 20 has a first electrode 21 connected through a first metal bonding wire 8-1 to the first pad electrode 130 and a second electrode 22 connected through a second metal bonding wire 8-2 to the second pad electrode 140.

An electrically conductive pattern 145 is provided on the first main face, wherein the electrically conductive pattern 145 extends from the second pad electrode 140 to a region between the first pad electrode 130 and the chip mounting electrode 120. The electrically conductive pattern 145 is unitary formed with the second pad electrode 140. The electrically conductive pattern 145 is electrically connected with the second pad electrode 140, which is further electrically connected through the fourth via hole 141 to the second pad electrode 144 on the second main face.

For the present invention, it is important that the electrically conductive pattern 145 having the ground potential is provided between the first electrode pad 130 and the chip mounting electrode 120 as the input and output electrodes. The electrically conductive pattern 145 is united with the second pad electrode 140 having the ground potential. The electrically conductive pattern 145 having the ground potential reduces a capacitance "Ccbpkgn" between the first electrode pad 130 and the chip mounting electrode 120 as the input and output electrodes as compared to when the electrically conductive pattern 145 is not provided.

If the second electrode 22 as an emitter electrode is grounded, the input-output feedback capacitance Ccb is given by Ccb=(Ccbchip+Ccbpkgn), where Ccbchip is the collector-base capacitance of the chip 20, and the Ccbpkgn is the capacitance between the first electrode pad 130 and the chip mounting electrode 120. The reduction of the capacitance "Ccbpkgn" reduces the input-output feedback capacitance Ccb, thereby preventing the maximum gain Gmax of the semiconductor device 100.

Respective sizes in FIG. 2F are assumed as follows. a1=1 mm. a2=b2=0.5 mm. a3=a5=0.05 mm. a4=a6=b3=b5=0.15 mm. a7=0.35. b1=0.6 mm. b4=0.20 mm. An estimated capacitance Ccbpkgn between the chip mounting electrode 120 and the first pad electrode 130 is then Ccbpkgn=10 fF. The characteristics of the transistor chip 20 are assumed as follows. A base resistance: Rb=14 ohms. A current gain cut-off frequency fT=16 GHz. A collector-base capacitance: C cbchip=150 fF. The maxim power gain Gmax at a frequency of 2 GHz is given by Gmax=[1/{8 πRb(Ccb+Ccbpkgn)}]×(f/fT)=18.5 dB. The power gain Gmax of the improved device of the present invention is higher by 1.2 dB than the power gain Gmax of the conventional device.

With reference to FIG. 3, the semiconductor chip 20 provided on the chip mounting electrode 120 may have the following structure. The chip 20 has a first face, on which a base electrode 21, an emitter electrode 22 and a transistor intrinsic region 25 are provided. The chip 20 h as a second face, on which a collector electrode 23 is provided. The sizes of the chip 20 are as follows. h=250–290 micrometers. w=250–290 micrometers. t2=120–140 micrometers.

Figure 4A:
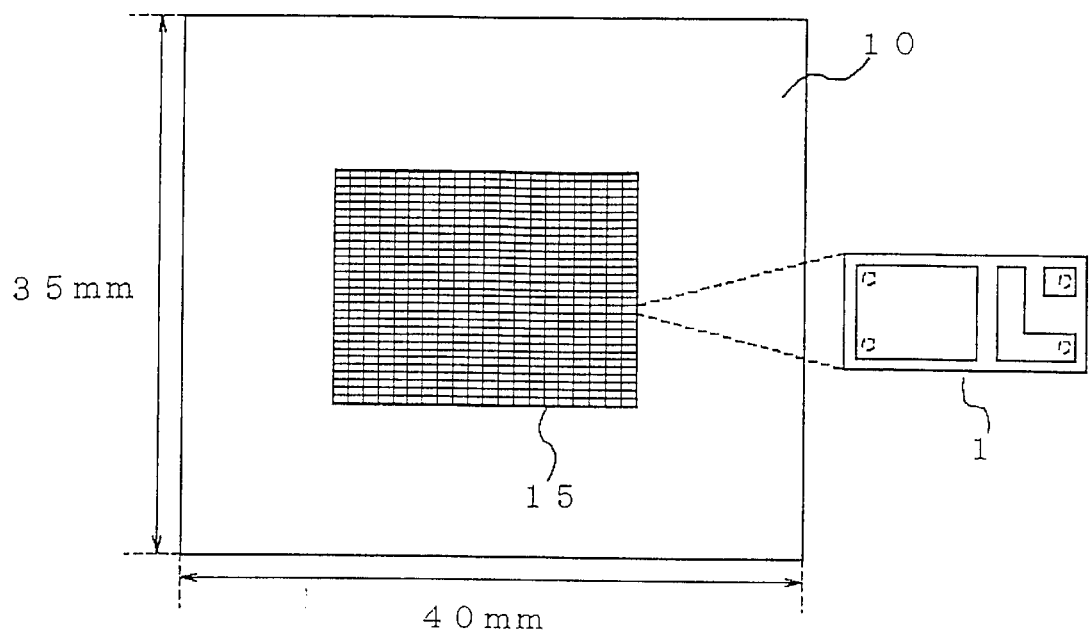
FIG. 4A is a schematic plan view of a ceramic substrate having a matrix array of mounting substrates of FIGS. 2A through 2I.
Figure 4B:
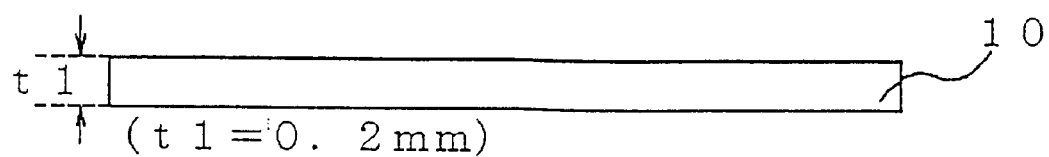
FIG. 4B is a side view of the ceramic substrate of FIG. 4A.
Figure 4C:
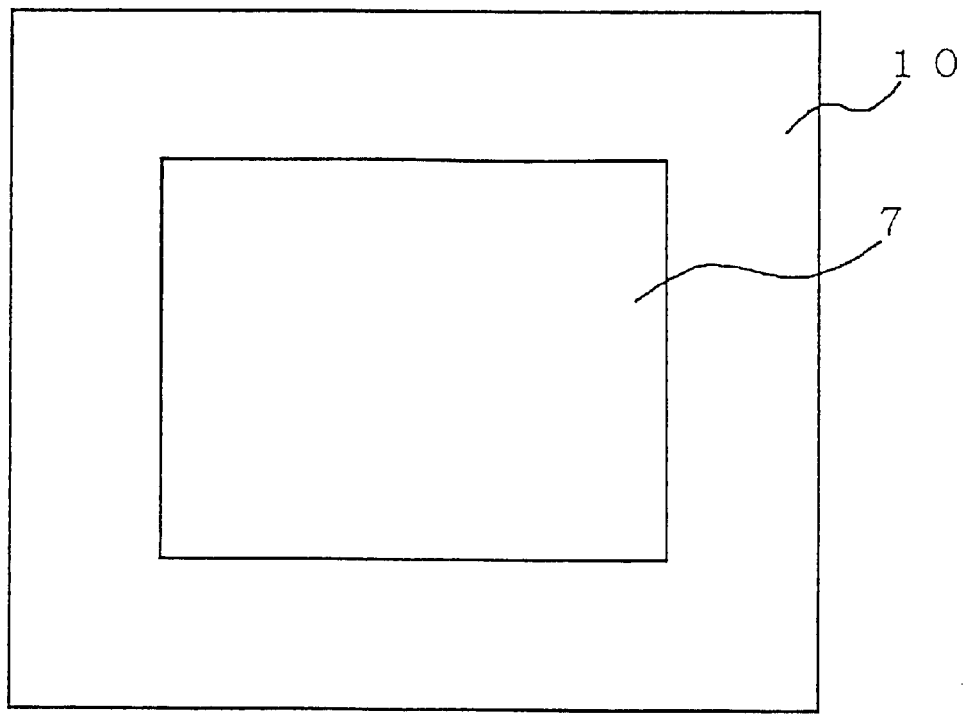
FIG. 4C is a schematic plan view of a resin-sealed ceramic substrate of FIGS. 2A through 2I.
Figure 4D:
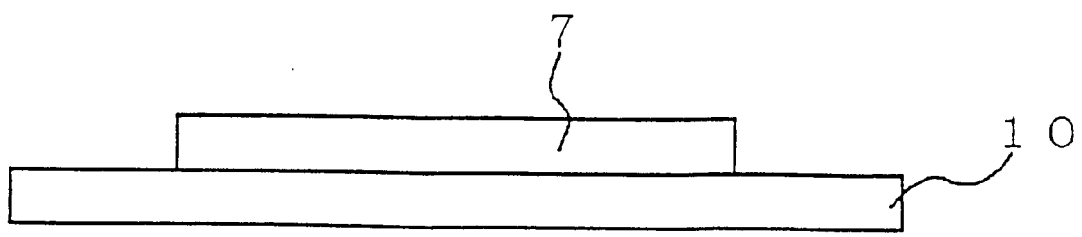
FIG. 4D is a side view of the resin-sealed ceramic substrate of FIG. 4C.
Figure 5:
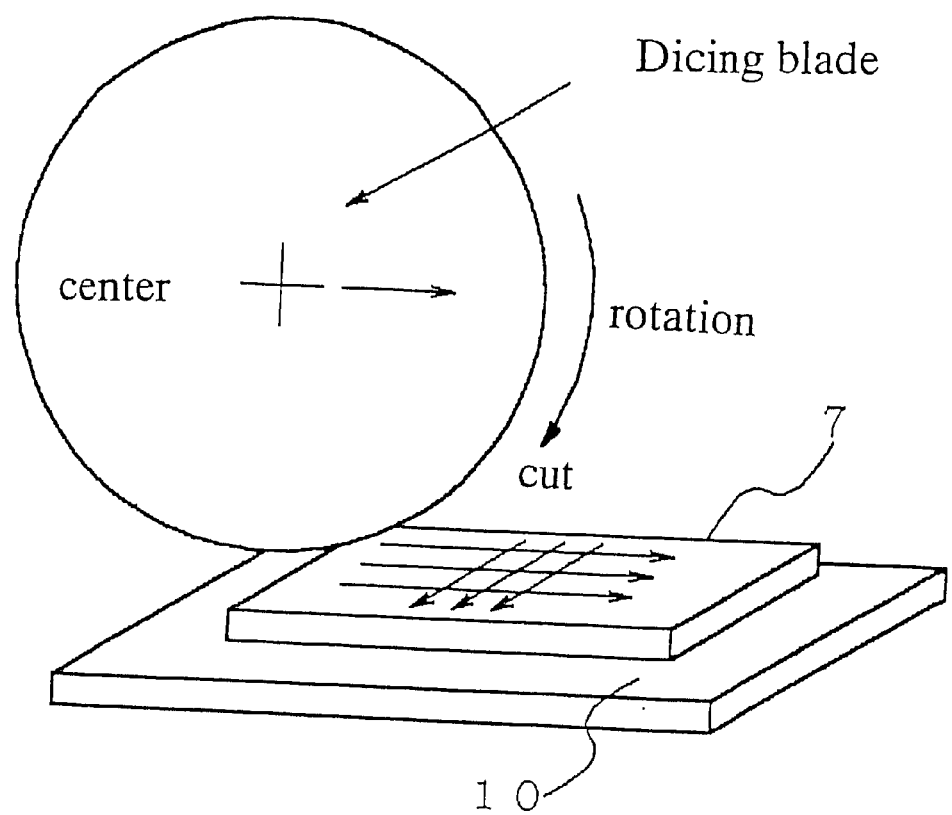
FIG. 5 is a schematic perspective view of a dicing process for forming cutting the resin-sealed ceramic substrate.

A method of forming the above semiconductor device will subsequently be described. FIG. 4A is a schematic plan view of a ceramic substrate having a matrix array of mounting substrates of FIGS. 2A through 2I. FIG. 4B is a side view of the ceramic substrate of FIG. 4A. FIG. 4C is a schematic plan view of a resin-sealed ceramic substrate of FIGS. 2A through 2I. FIG. 4D is a side view of the resin-sealed ceramic substrate of FIG. 4C. FIG. 5 is a schematic perspective view of a dicing process for forming cutting the resin-sealed ceramic substrate.

In the first step, the transistor chip 20 shown in FIG. 3 is prepared by the know fabrication processes.

A ceramic substrate 10 is prepared, which has a first face having a 20×30 matrix array 15 of mounting substrates 1 which are shown in FIGS. 2A through 2I, provided that the mounting substrates 1 are free of the chips 20. The ceramic substrate 10 has a size of 35 mm×40 mm and has a thickness of 0.2 mm. Each of the mounting substrates 1 has a size of 0.5 mm×1 mm.

The chips 20 are formed on the chip mounting electrodes 120 of the mounting substrates 1 by using an Au-Si raw material.

The base electrode 21 of the chip 20 is bonded through the first bonding wire 8-1 to the first pad electrode 130. Further, the emitter electrode 22 of the chip 20 is bonded through the second bonding wire 8-2 to the second pad electrode 140.

The 20×30 matrix array 15 is sealed with the sealing resin 7.

With reference to FIG. 5, the resin-sealed ceramic substrate 10 is cut by a dicing blade to form plural lead-less semiconductor devices 100.

Second Embodiment

Figure 6A:
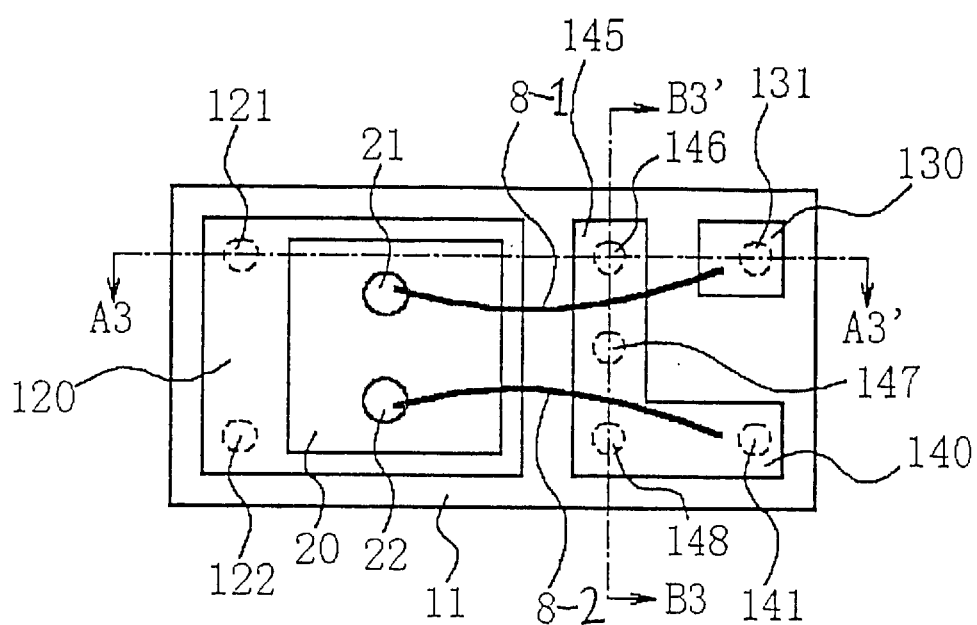
FIG. 6A is a plan view of a first main face of a mounting substrate of the lead-less semiconductor device in a second embodiment in accordance with the present invention.
Figure 6B:
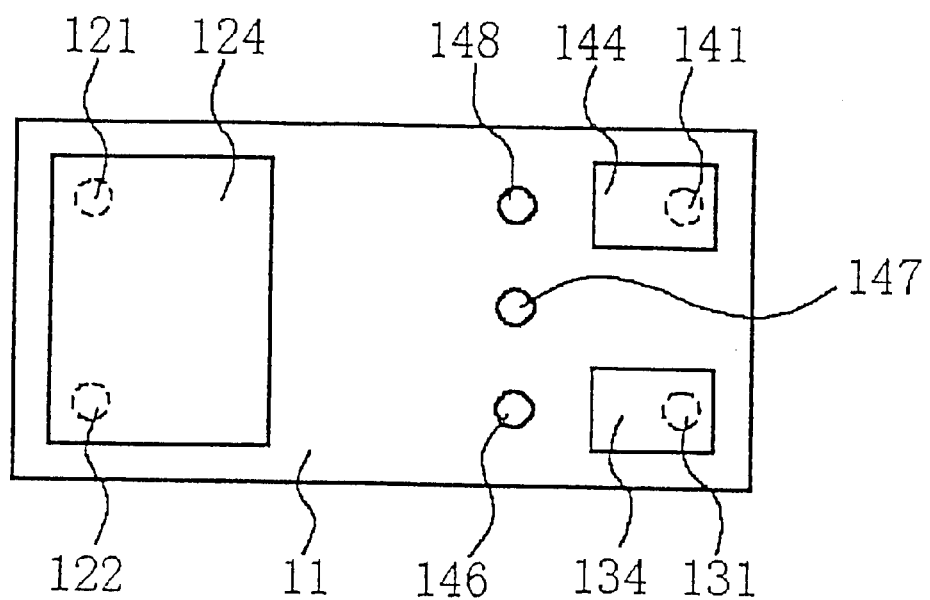
FIG. 6B is a plan view of a second main face of the mounting substrate of the lead-less semiconductor device of FIG. 6A.
Figure 6C:
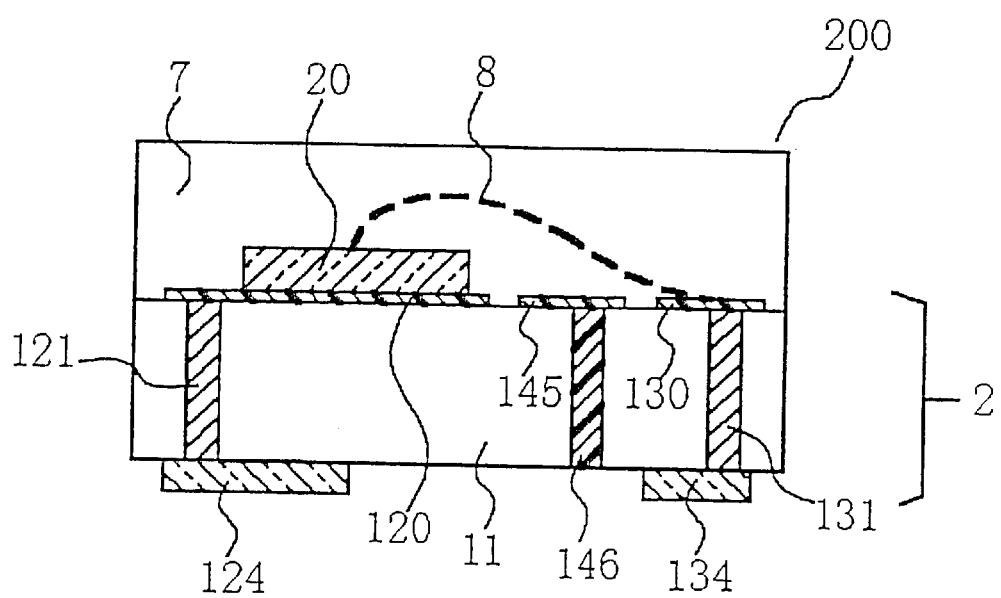
FIG. 6C is a cross sectional elevation view of the lead-less semiconductor device, taken along an A3–A3' line in FIG. 6A.
Figure 6D:
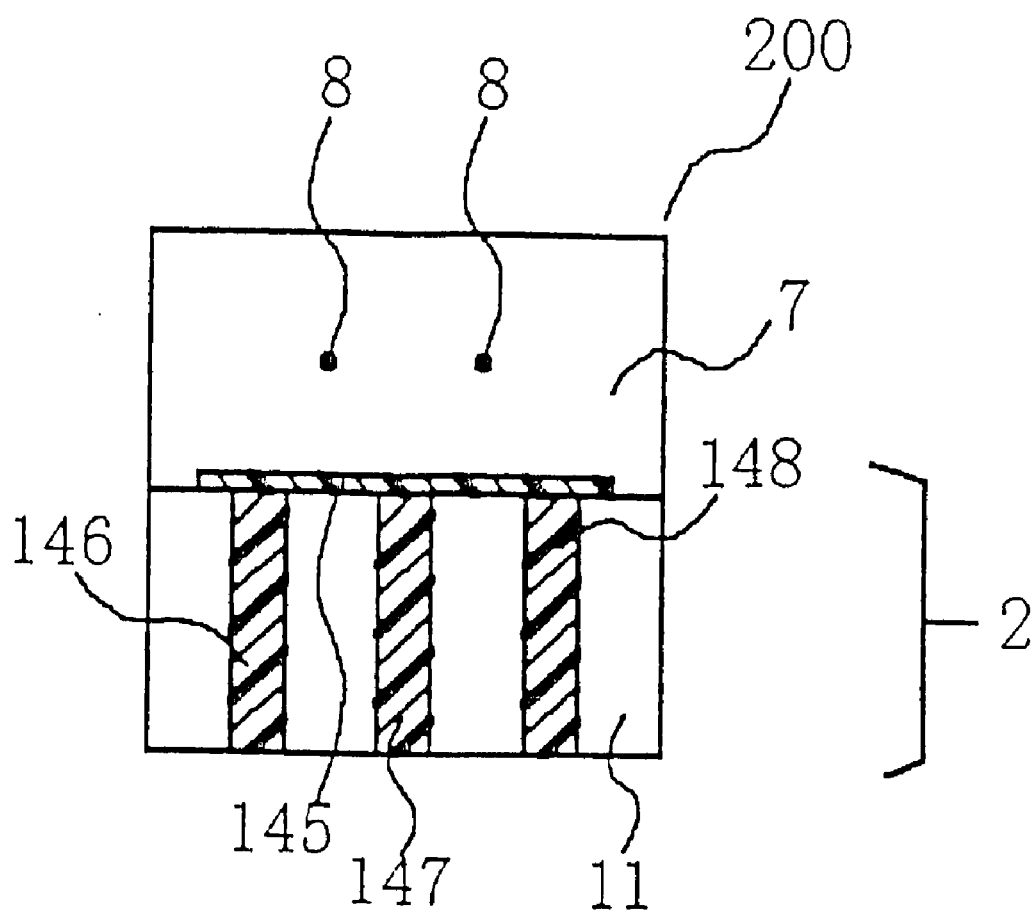
FIG. 6D is a cross sectional elevation view of the lead-less semiconductor device, taken along a B3–B3' line in FIG. 6A.

A second embodiment according to the present invention will be described in detail with reference to the drawings. FIG. 6A is a plan view of a first main face of a mounting substrate of the lead-less semiconductor device in a second embodiment in accordance with the present invention. FIG. 6B is a plan view of a second main face of the mounting substrate of the lead-less semiconductor device of FIG. 6A. FIG. 6C is a cross sectional elevation view of the lead-less semiconductor device, taken along an A3–A3' line in FIG. 6A. FIG. 6D is a cross sectional elevation view of the lead-less semiconductor device, taken along a B3–B3' line in FIG. 6A.

With reference to FIGS. 6A through 6D, a semiconductor device 200 has a mounting substrate 2 and a sealing resin 7. The mounting substrate 2 has a first main face which is adjacent to the sealing resin 7 and a second main face which is positioned opposite to the first main face. The mounting substrate 2 comprises a ceramic-base 11. On the first main face, a chip mounting electrode 120 is provided for mounting a semiconductor chip 20, and also first and second pad electrodes 130 and 140.

On the second main face, first, second and third terminal electrodes 124, 134 and 144 are provided for external connections. The first terminal electrode 124 is connected through first and second via holes 121 and 122 to the chip mounting electrode 120. The second terminal electrode 134 is connected through a third via hole 131 to the first pad electrode 130. The third terminal electrode 144 is connected through a fourth via hole 141 to the second pad electrode 140. The semiconductor chip 20 has a first electrode 21 connected through a first metal bonding wire 8-1 to the first pad electrode 130 and a second electrode 22 connected through a second metal bonding wire 8-2 to the second pad electrode 140.

An electrically conductive pattern 145 is provided on the first main face, wherein the electrically conductive pattern 145 extends from the second pad electrode 140 to a region between the first pad electrode 130 and the chip mounting electrode 120. The electrically conductive pattern 145 is unitary formed with the second pad electrode 140. The electrically conductive pattern 145 is electrically connected with the second pad electrode 140, which is further electrically connected through the fourth via hole 141 to the second pad electrode 144 on the second main face.

Further, first to third through holes 146, 147 and 148 are provided in the ceramic base 11, so that the first to third through holes 146, 147 and 148 are in contact with the electrically conductive pattern 145. The first through hole 146 is positioned on a line segment which connects between the via holes 121 and 131. Namely, the first through hole 146 is positioned between the first pad electrode 130 and the chip mounting substrate 220. The third through hole 148 is positioned on another line segment which connects between the via holes 122 and 141. Namely, the third through hole 148 is positioned between the second pad electrode 140 and the chip mounting substrate 220. The second through hole 147 is positioned between the first and third through holes 146 and 148.

For the present invention, it is important that the electrically conductive pattern 145 having the ground potential is provided between the first electrode pad 130 and the chip mounting electrode 120 as the input and output electrodes. The electrically conductive pattern 145 is united with the second pad electrode 140 having the ground potential. The electrically conductive pattern 145 having the ground potential reduces a capacitance "Ccbpkgn" between the first electrode pad 130 and the chip mounting electrode 120 as the input and output electrodes as compared to when the electrically conductive pattern 145 is not provided.

For the present invention, it is also important that the first to third through holes 146, 147 and 148 are provided between the first and second pad electrodes 130 and 140 and the chip mounting electrode 120. The first to third through holes 146, 147 and 148 suppress the interference between the input and output terminals.

Third Embodiment

Figure 7A:
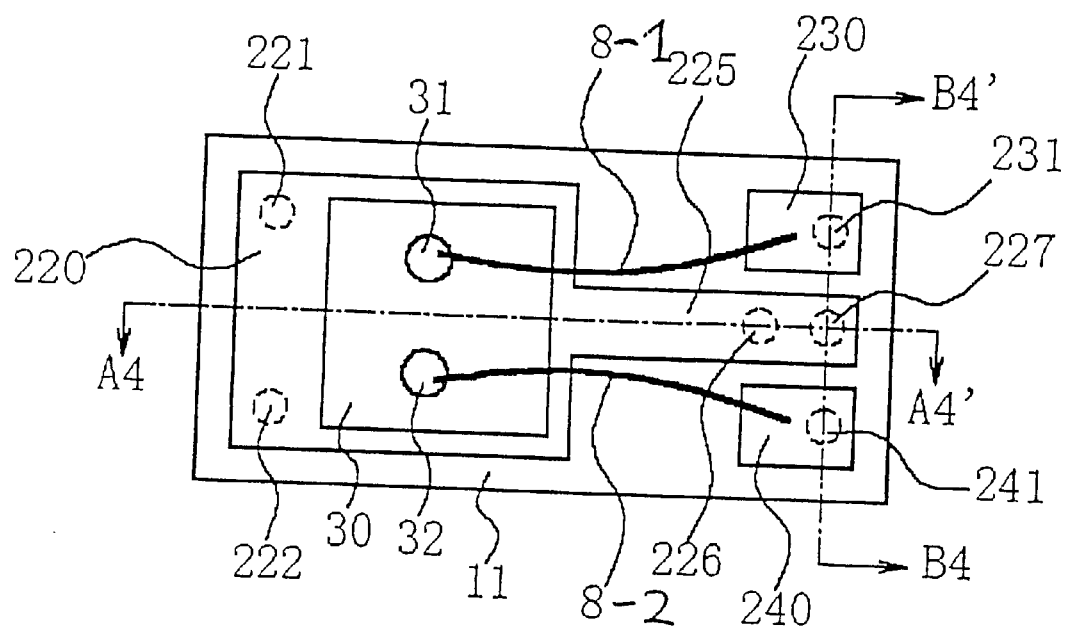
FIG. 7A is a plan view of a first main face of a mounting substrate of the lead-less semiconductor device in a third embodiment in accordance with the present invention.
Figure 7B:
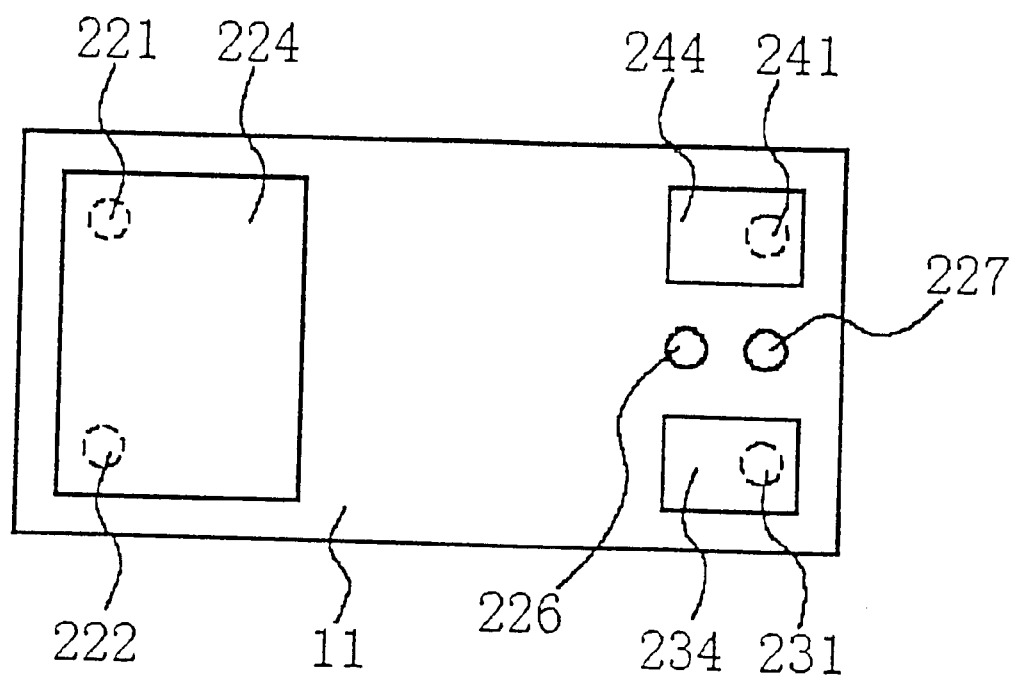
FIG. 7B is a plan view of a second main face of the mounting substrate of the lead-less semiconductor device of FIG. 7A.
Figure 7C:
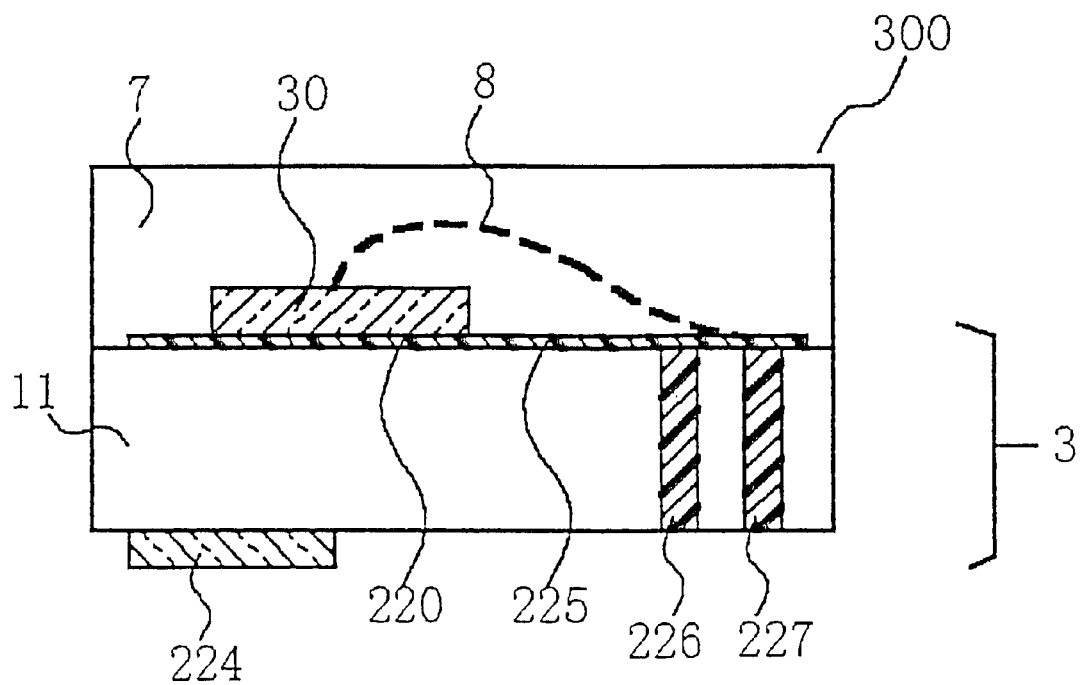
FIG. 7C is a cross sectional elevation view of the lead-less semiconductor device, taken along an A4–A4' line in FIG. 7A.
Figure 7D:
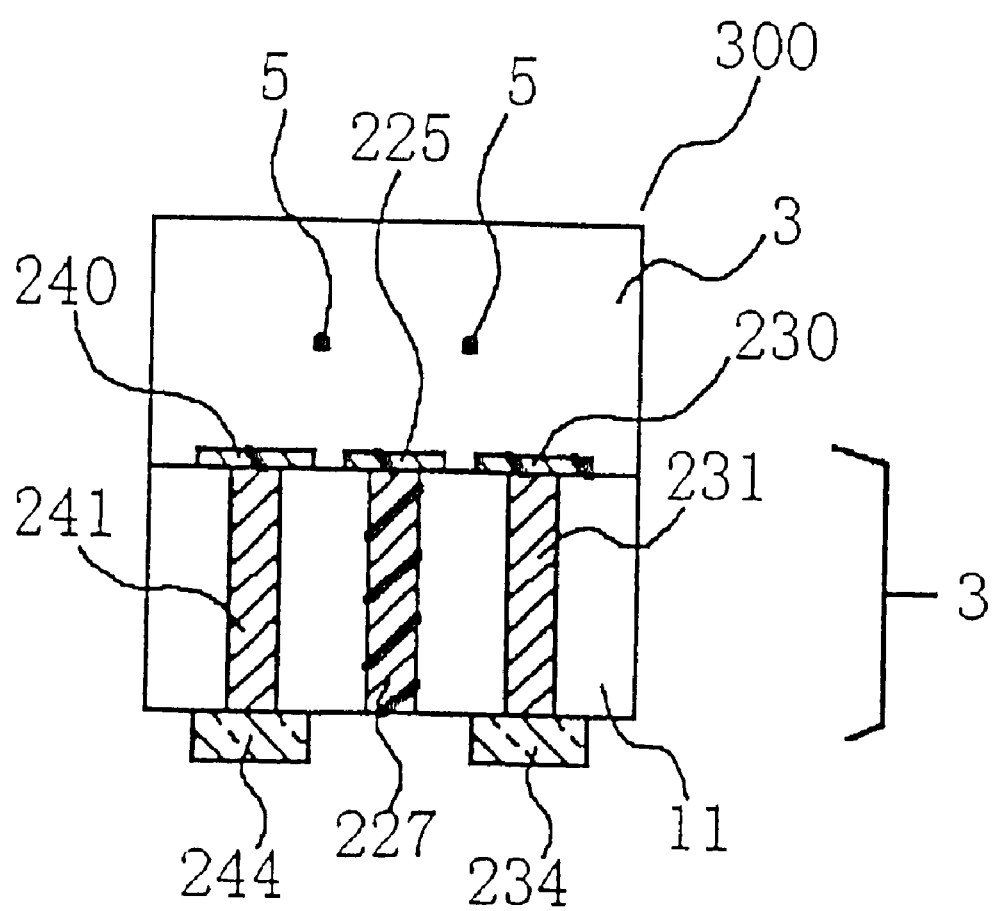
FIG. 7D is a cross sectional elevation view of the lead-less semiconductor device, taken along a B4–B4' line in FIG. 7A.

A third embodiment according to the present invention will be described in detail with reference to the drawings. FIG. 7A is a plan view of a first main face of a mounting substrate of the lead-less semiconductor device in a third embodiment in accordance with the present invention. FIG. 7B is a plan view of a second main face of the mounting-substrate of the lead-less semiconductor device of FIG. 7A. FIG. 7C is a cross sectional elevation view of the lead-less semiconductor device, taken along an A4–A4' line in FIG. 7A. FIG. 7D is a cross sectional elevation view of the lead-less semiconductor device, taken along a B4–B4' line in FIG. 7A.

With reference to FIGS. 7A through 7D, a semiconductor device 300 has a mounting substrate 3 and a sealing resin 7. The mounting substrate 3 has a first main face which is adjacent to the sealing resin 7 and a second main face which is positioned opposite to the first main face. The mounting substrate 3 comprises a ceramic-base 11. On the first main face, a chip mounting electrode 220 is provided for mounting a semiconductor chip 30, and also first and second pad electrodes 230 and 240.

On the second main face, first, second and third terminal electrodes 224, 234 and 244 are provided for external connections. The first terminal electrode 224 is connected through first and second via holes 221 and 222 to the chip mounting electrode 220. The second terminal electrode 234 is connected through a third via hole 231 to the first pad electrode 230. The third terminal electrode 244 is connected through a fourth via hole 241 to the second pad electrode 240. The semiconductor chip 30 has a first electrode 31 connected through a first metal bonding wire 8-1 to the first pad electrode 230 and a second electrode 32 connected through a second metal bonding wire 8-2 to the second pad electrode 240.

An electrically conductive pattern 225 is provided on the first main face, wherein the electrically conductive pattern 225 extends from the chip mounting electrode 220 to a region between the first and second pad electrodes 230 and 240. The electrically conductive pattern 225 is unitary formed with the chip mounting electrode 220. The electrically conductive pattern 225 is electrically connected with the chip mounting electrode 220, which is further electrically connected through the via holes 221 and 222 to the first pad electrode 224 on the second main face.

Further, first and second through holes 226 and 227 are provided in the ceramic base 11 and positioned between the first and second pad electrodes 234 and 244, so that the first and second through holes 226 and 227 are in contact with the electrically conductive pattern 225.

The chip 30 is a field effect transistor chip. The first electrode 31 of the field effect transistor chip 30 is a gate electrode, the second electrode 32 of the field effect transistor chip 30 is a drain electrode, and a source electrode is ground. Namely, the chip mounting electrode 220 is grounded. The gate electrode 31 serves as a signal input electrode. The drain electrode 32 serves as a signal output electrode. The first pad electrode 230 is electrically connected through the first bonding wire 8-1 to the signal input electrode 31. The second pad electrode 240 is electrically connected through the second bonding wire 8-2 to the signal output electrode 32. The electrically conductive pattern 225 is connected with the chip mounting electrode 220 which is grounded.

For the present invention, it is important that the electrically conductive pattern 225 having the ground potential extends to the region between the first and second pad electrodes 230 and 240 as the input and output electrodes. The electrically conductive pattern 225 having the ground potential reduces a feedback capacitance and also suppresses an interference between the input and output terminals.

For the present invention, it is also important that the first and second through holes 226 and 227 are provided between the first and second pad electrodes 230 and 240. The first and second through holes 226 and 227 suppress the interference between the input and output terminals.

It is optionally possible that the first and second through holes 226 and 227 are not provided.

Fourth Embodiment

Figure 8A:
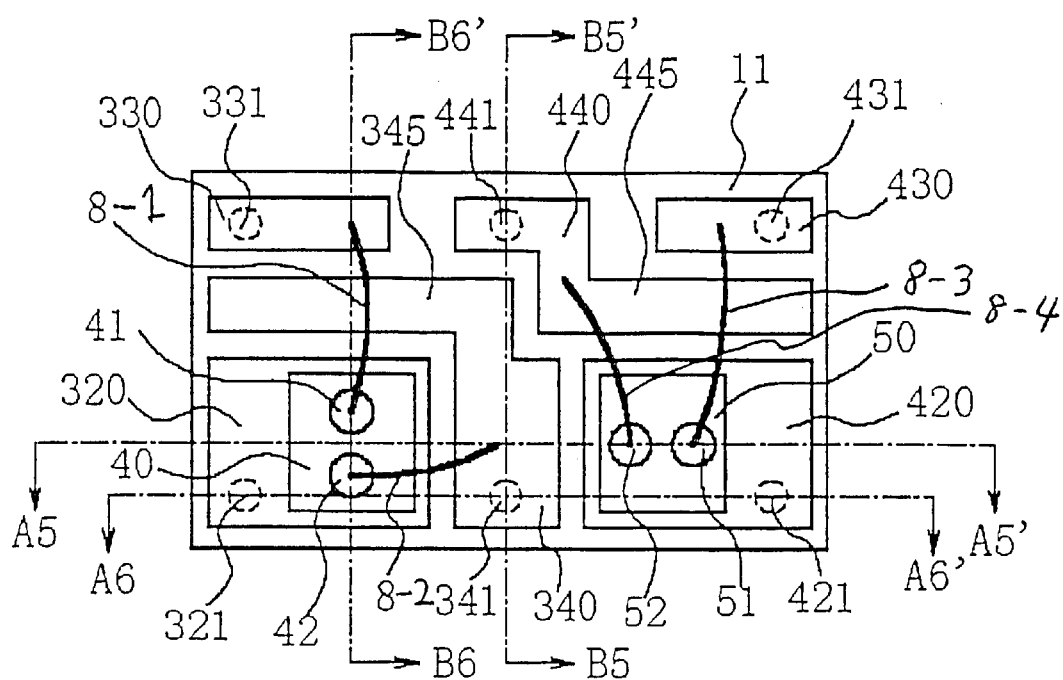
FIG. 8A is a plan view of a first main face of a mounting substrate of the lead-less semiconductor device in a fourth embodiment in accordance with the present invention.
Figure 8B:
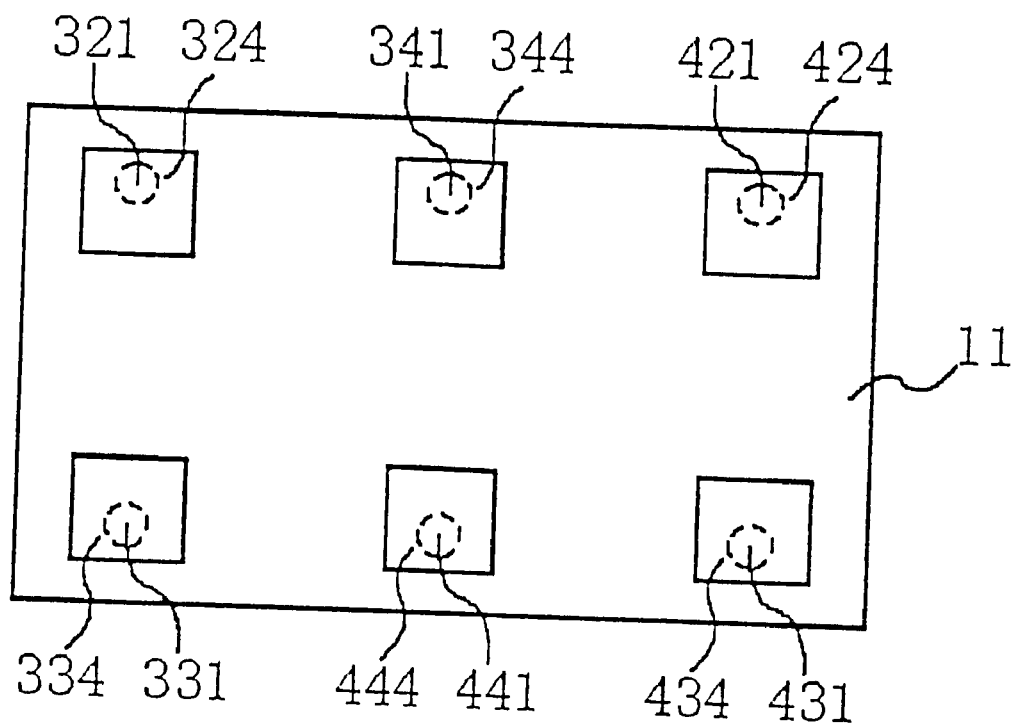
FIG. 8B is a plan view of a second main face of the mounting substrate of the lead-less semiconductor device of FIG. 8A.
Figure 8C:
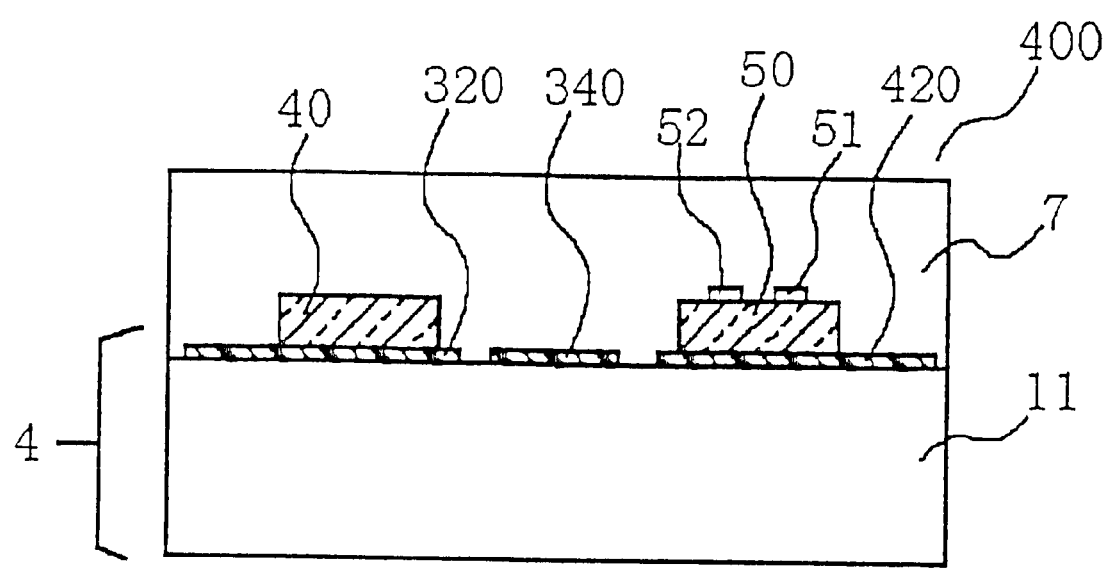
FIG. 8C is a cross sectional elevation view of the lead-less semiconductor device, taken along an A5–A5' line in FIG. 8A.
Figure 8D:
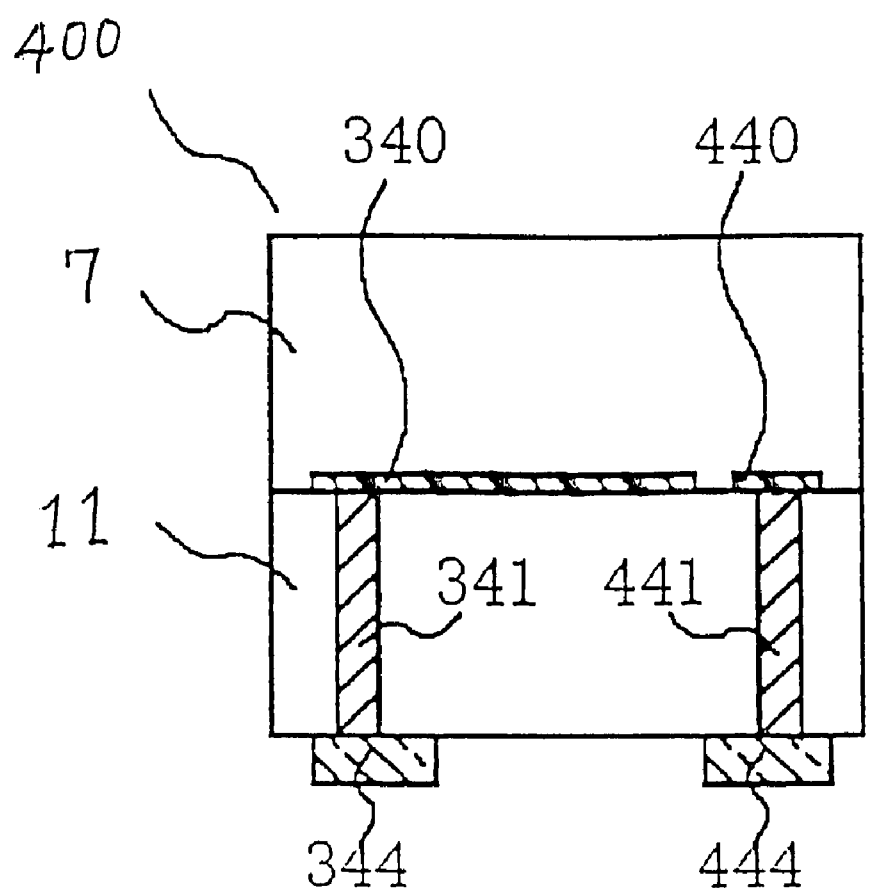
FIG. 8D is a cross sectional elevation view of the lead-less semiconductor device, taken along a B5–B5' line in FIG. 8A.
Figure 8E:
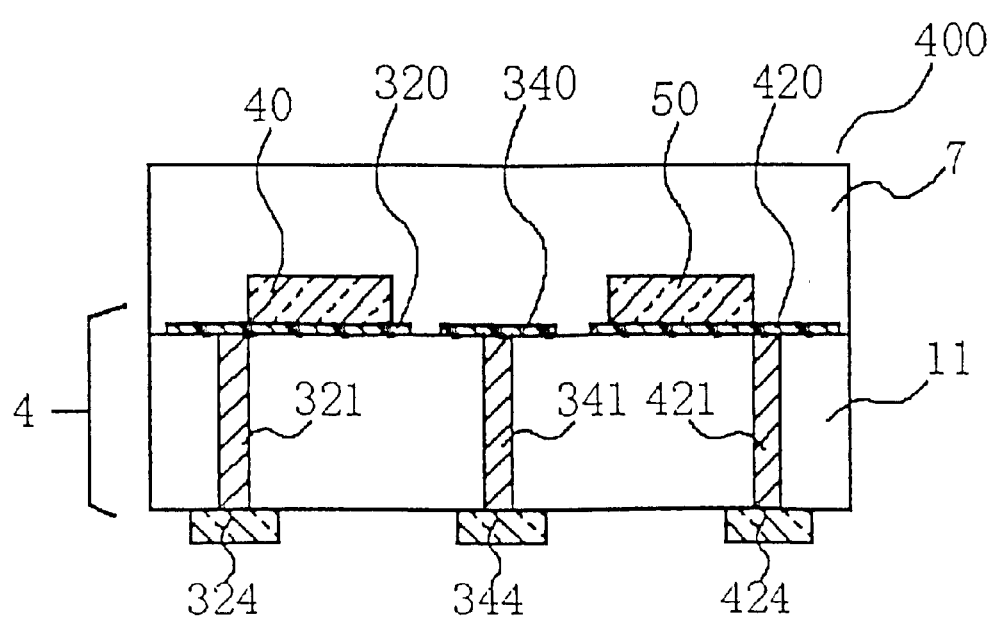
FIG. 8E is a cross sectional elevation view of the lead-less semiconductor device, taken along an A6–A6' line in FIG. 8A.
Figure 8F:
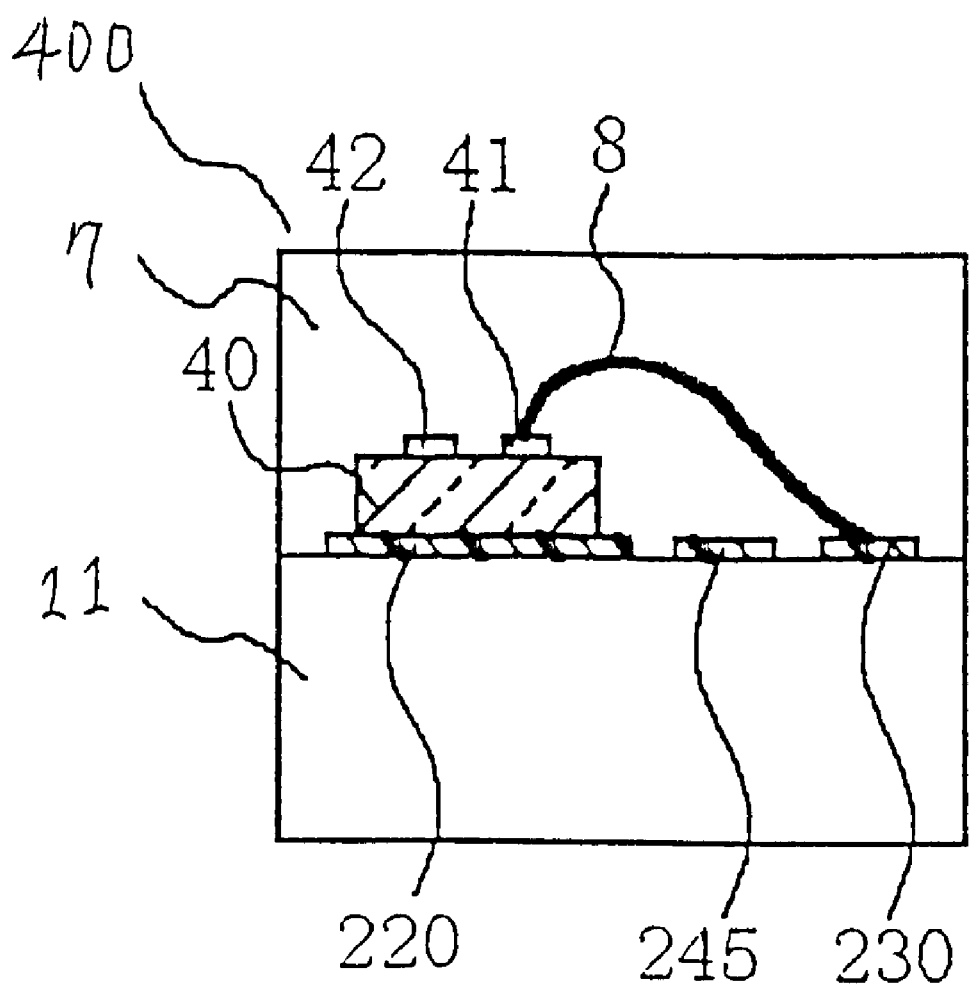
FIG. 8F is a cross sectional elevation view of the lead-less semiconductor device, taken along a B6–B6' line in FIG. 8A.

A fourth embodiment according to the present invention will be described in detail with reference to the drawings. FIG. 8A is a plan view of a first main face of a mounting substrate of the lead-less semiconductor device in a fourth embodiment in accordance with the present invention. FIG. 8B is a plan view of a second main face of the mounting substrate of the lead-less semiconductor device of FIG. 8A. FIG. 8C is a cross sectional elevation view of the lead-less semiconductor device, taken along an A5–A5' line in FIG. 8A. FIG. 8D is a cross sectional elevation view of the lead-less semiconductor device, taken along a B5–B5' line in FIG. 8A. FIG. 8E is a cross sectional elevation view of the lead-less semiconductor device, taken along an A6–A6' line in FIG. 8A. FIG. 8F is a cross sectional elevation view of the lead-less semiconductor device, taken along a B6–B6' line in FIG. 8A.

With reference to FIGS. 8A through 8F, a semiconductor device 400 has a mounting substrate 4 and a sealing resin 7. The mounting substrate 4 has a first main face which is adjacent to the sealing resin 7 and a second main face which is positioned opposite to the first main face. The mounting substrate 4 comprises a ceramic-base 11. On the first main face, first and second chip mounting electrodes 320 and 420 are provided for mounting first and second semiconductor chips 40 and 50, and a lso first and second pad electrodes 330 and 340 and third and fourth pad electrodes 430 and 440. A first set comprises the first chip mounting electrode 320 and the first and second pad electrodes 330 and 340. A second set comprises the second chip mounting electrode 420 and the third and fourth pad electrodes 430 and 440.

On the second main face, first, second and third terminal electrodes 324, 334 and 344 and fourth, fifth and sixth terminal electrodes 424, 434 and 444 are provided for external connections. The first terminal electrode 324 is connected through a first via hole 321 to the first chip mounting electrode 320. The second terminal electrode 334 is connected through a second via hole 331 to the first pad electrode 330. The third terminal electrode 344 is connected through a third via hole 341 to the second pad electrode 340. The fourth terminal electrode 434 is connected through a fourth via hole 431 to the second chip mounting electrode 420. The fifth terminal electrode 424 is connected through a fifth via hole 421 to the third pad electrode 430. The sixth terminal electrode 444 is connected through a sixth via hole 441 to the fourth pad electrode 440.

The first semiconductor chip 40 mounted on the first chip mounting electrode 320 has a first electrode 41 connected through a first metal bonding wire 8-1 to the first pad electrode 330 and a second electrode 42 connected through a second metal bonding wire 8-2 to the second pad electrode 340. The second semiconductor chip 50 mounted on the second chip mounting electrode 420 has a third electrode 51 connected through a third metal bonding wire 8-3 to the third pad electrode 430 and a fourth electrode 52 connected through a fourth metal bonding wire 84 to the fourth pad electrode 440.

A first electrically conductive pattern 345 is provided on the first main face, wherein the first electrically conductive pattern 345 extends from the second pad electrode 340 to a region between the first pad electrode 330 and the first chip mounting electrode 320. The first electrically conductive pattern 345 is unitary formed with the second pad electrode 340. The first electrically conductive pattern 345 is electrically connected with the second pad electrode 340, which is further electrically connected through the third via hole 341 to the third pad electrode 344 on the second main face.

A second electrically conductive pattern 445 is also provided on the first main face, wherein the second electrically conductive pattern 445 extends from the fourth pad electrode 440 to another region between the third pad electrode 430 and the second chip mounting electrode 420. The second electrically conductive pattern 445 is unitary formed with the fourth pad electrode 440. The second electrically conductive pattern 445 is electrically connected with the fourth pad electrode 440, which is further electrically connected through the sixth via hole 441 to the sixth pad electrode 444 on the second main face.

The first and fourth terminal electrodes 324 and 424 connected to the first and second chip mounting electrodes 320 and 420 respectively are positioned in opposite sides symmetrically with reference to a line segment which connects between the third and sixth terminal electrodes 344 and 444 connected to the second and fourth pad electrodes 340 and 440 respectively. The second and fifth terminal electrodes 334 and 434 connected to the first and third pad electrodes 330 and 430 respectively are positioned in opposite sides symmetrically with reference to the above line segment.

For the present invention, it is important that the first electrically conductive pattern 345 having the ground potential is provided between the first electrode pad 330 and the first chip mounting electrode 320 as the input and output electrodes. The first electrically conductive pattern 345 is united with the second pad electrode 340 having the ground potential. The first electrically conductive pattern 345 having the ground potential reduces a first capacitance between the first electrode pad 330 and the first chip mounting electrode 320 as the input and output electrodes as compared to when the first electrically conductive pattern 345 is not provided.

It is also important that the second electrically conductive pattern 445 having the ground potential is provided between the third electrode pad 430 and the second chip mounting electrode 420 as the input and output electrodes. The second electrically conductive pattern 445 is united with the fourth pad electrode 440 having the ground potential. The second electrically conductive pattern 445 having the ground potential reduces a second capacitance between the third electrode pad 430 and the second chip mounting electrode 420 as the input and output electrodes as compared to when the second electrically conductive pattern 445 is not provided.

Fifth Embodiment

Figure 9A:
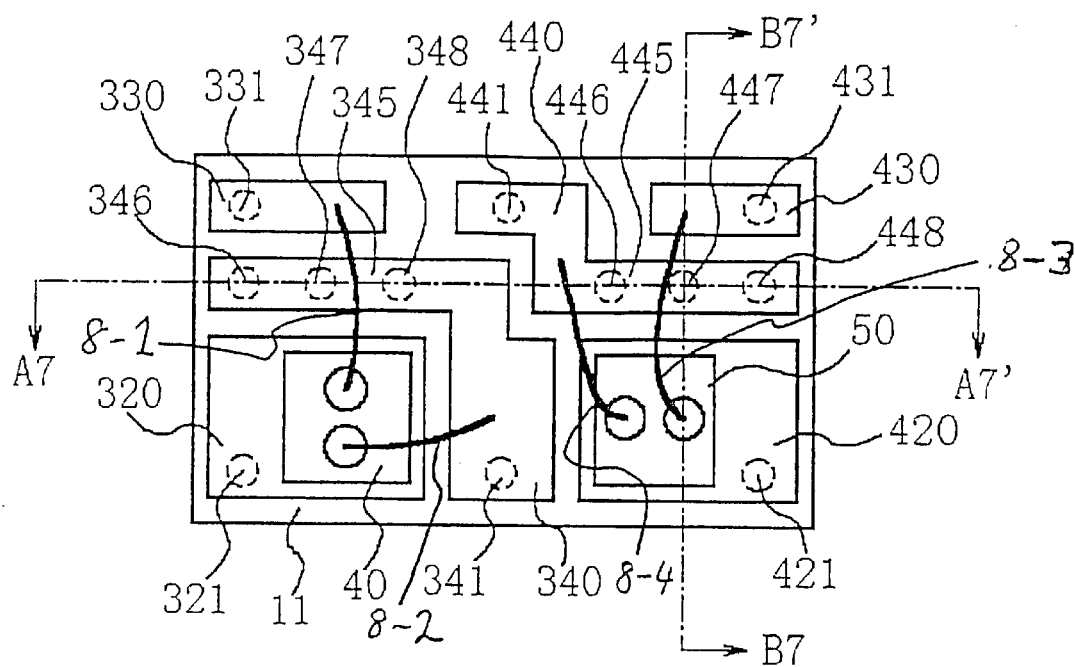
FIG. 9A is a plan view of a first main face of a mounting substrate of the lead-less semiconductor device in a fifth embodiment in accordance with the present invention.
Figure 9B:
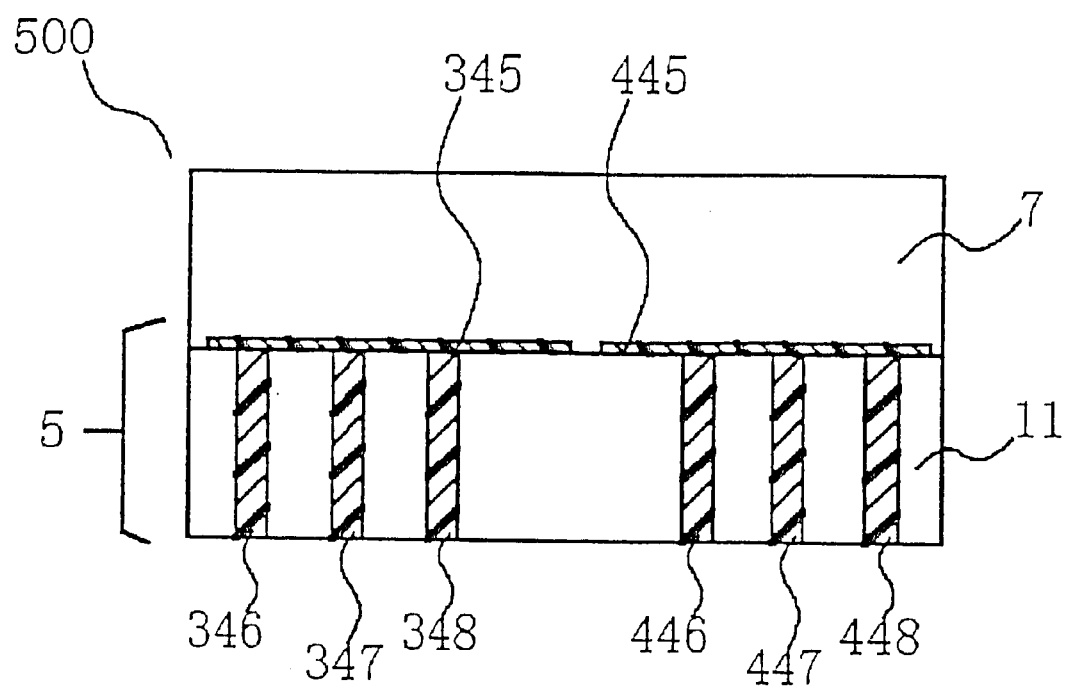
FIG. 9B is a cross sectional elevation view of the lead-less semiconductor device, taken along an A7–A7' line in FIG. 9A.
Figure 9C:
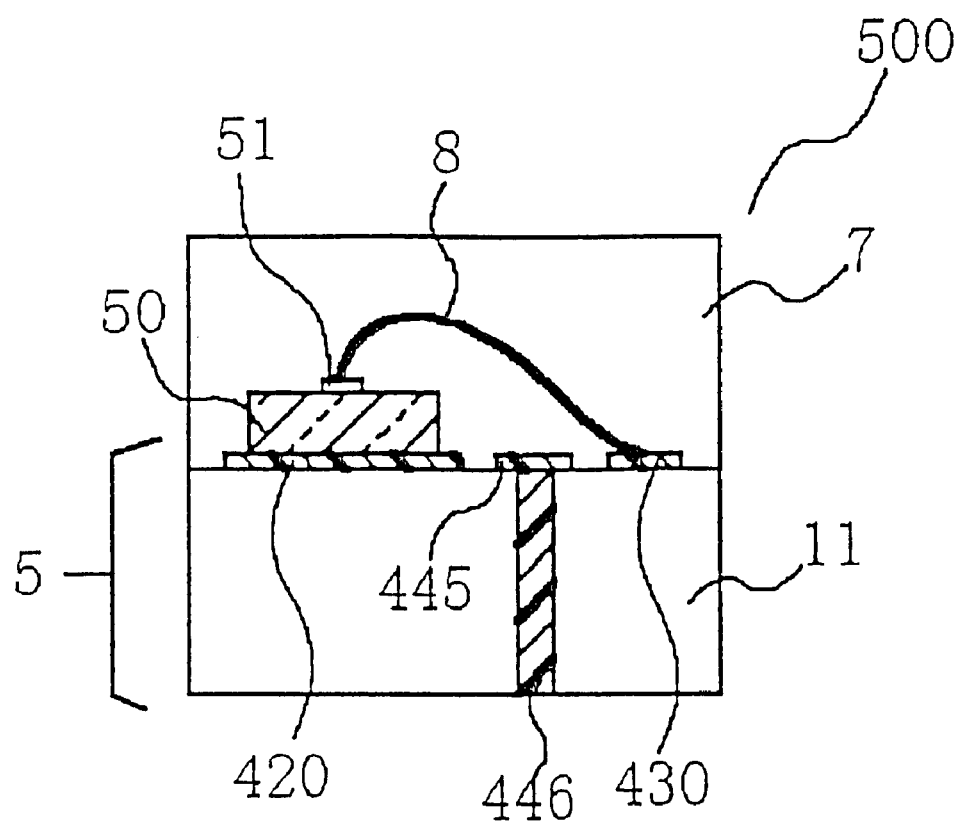
FIG. 9C is a cross sectional elevation view of the lead-less semiconductor device, taken along a B7–B7' line in FIG. 9A.

A fifth embodiment according to the present invention will be described in detail with reference to the drawings. FIG. 9A is a plan view of a first main face of a mounting substrate of the lead-less semiconductor device in a fifth embodiment in accordance with the present invention. FIG. 9B is a cross sectional elevation view of the lead-less semiconductor device, taken along an A7–A7' line in FIG. 9A. FIG. 9C is a cross sectional elevation view of the lead-less semiconductor device, taken along a B7–B7' line in FIG. 9A.

With reference to FIGS. 9A through 9C, a semiconductor device 500 has a mounting substrate 5 and a sealing resin 7. The mounting substrate 5 has a first main face which is adjacent to the sealing resin 7 and a second main face which is positioned opposite to the first main face. The mounting substrate 5 comprises a ceramic-base 11. On the first main face, first and second chip mounting electrodes 320 and 420 are provided for mounting first and second semiconductor chips 40 and 50, and a lso first and second pad electrodes 330 and 340 and third and fourth pad electrodes 430 and 440. A first set comprises the first chip mounting electrode 320 and the first and second pad electrodes 330 and 340. A second set comprises the second chip mounting electrode 420 and the third and fourth pad electrodes 430 and 440.

On the second main face, first, second and third terminal electrodes 324, 334 and 344 and fourth, fifth and sixth terminal electrodes 424, 434 and 444 are provided for external connections. The first terminal electrode 324 is connected through a first via hole 321 to the first chip mounting electrode 320. The second terminal electrode 334 is connected through a second via hole 331 to the first pad electrode 330. The third terminal electrode 344 is connected through a third via hole 341 to the second pad electrode 340. The fourth terminal electrode 434 is connected through a fourth via hole 431 to the second chip mounting electrode 420. The fifth terminal electrode 424 is connected through a fifth via hole 421 to the third pad electrode 430. The sixth terminal electrode 444 is connected through a sixth via hole 441 to the fourth pad electrode 440.

The first semiconductor chip 40 mounted on the first chip mounting electrode 320 has a first electrode 41 connected through a first metal bonding wire 8-1 to the first pad electrode 330 and a second electrode 42 connected through a second metal bonding wire 8-2 to the second pad electrode 340. The second semiconductor chip 50 mounted on the second chip mounting electrode 420 has a third electrode 51 connected through a third metal bonding wire 8-3 to the third pad electrode 430 and a fourth electrode 52 connected through a fourth metal bonding wire 8-4 to the fourth pad electrode 440.

A first electrically conductive pattern 345 is provided on the first main face, wherein the first electrically conductive pattern 345 extends from the second pad electrode 340 to a region between the first pad electrode 330 and the first chip mounting electrode 320. The first electrically conductive pattern 345 is unitary formed with the second pad electrode 340. The first electrically conductive pattern 345 is electrically connected with the second pad electrode 340, which is further electrically connected through the third via hole 341 to the third pad electrode 344 on the second main face.

A second electrically conductive pattern 445 is also provided on the first main face, wherein the second electrically conductive pattern 445 extends from the fourth pad electrode 440 to another region between the third pad electrode 430 and the second chip mounting electrode 420. The second electrically conductive pattern 445 is unitary formed with the fourth pad electrode 440. The second electrically conductive pattern 445 is electrically connected with the fourth pad electrode 440, which is further electrically connected through the sixth via hole 441 to the sixth pad electrode 444 on the second main face.

The first and fourth terminal electrodes 324 and 424 connected to the first and second chip mounting electrodes 320 and 420 respectively are positioned in opposite sides symmetrically with reference to a line segment which connects between the third and sixth terminal electrodes 344 and 444 connected to the second and fourth pad electrodes 340 and 440 respectively. The second and fifth terminal electrodes-334 and 434 connected to the first and third pad electrodes 330 and 430 respectively are positioned in opposite sides symmetrically with reference to the above line segment.

Further, first to third through holes 346, 347 and 348 are provided in the ceramic base 11, so that the first to third through holes 346, 347 and 348 are in contact with the first electrically conductive pattern 145. The first through hole 346 is positioned on a line segment which connects between the via holes 321 and 331. Namely, the first through hole 346 is positioned between the first pad electrode 330 and the first chip mounting substrate 320. The third through hole 348 is positioned on another line segment which is perpendicular to the above line segment connecting between the via holes 321 and 331. The second through hole 347 is positioned between the first and third through holes 346 and 348.

Furthermore, fourth to sixth through holes 446, 447 and 448 are also provided in the ceramic base 11, so that the fourth to sixth through holes 446, 447 and 448 are in contact with the second electrically conductive pattern 445. The sixth through hole 448 is positioned on another line segment which connects between the via holes 421 and 431. Namely, the sixth through hole 448 is positioned between the third pad electrode 430 and the second chip mounting substrate 420. The fourth through hole 446 is positioned on another line segment which is perpendicular to the above line segment connecting between the via holes 421 and 431. The fifth through hole 447 is positioned between the fourth and sixth through holes 446 and 448.

For the present invention, it is important that the first electrically conductive pattern 345 having the ground potential is provided between the first electrode pad 330 and the first chip mounting electrode 320 as the input and output electrodes. The first electrically conductive pattern 345 is united with the second pad electrode 340 having the ground potential. The first electrically conductive pattern 345 having the ground potential reduces a first capacitance between the first electrode pad 330 and the first chip mounting electrode 320 as the input and output electrodes as compared to when the first electrically conductive pattern 345 is not provided.

It is also important that the second electrically conductive pattern 445 having the ground potential is provided between the third electrode pad 430 and the second chip mounting electrode 420 as the input and output electrodes. The second electrically conductive pattern 445 is united with the fourth pad electrode 440 having the ground potential. The second electrically conductive pattern 445 having the ground potential reduces a second capacitance between the third electrode pad 430 and the second chip mounting electrode 420 as the input and output electrodes as compared to when the second electrically conductive pattern 445 is not provided.

For the present invention, it is also important that the first to third through holes 346, 347 and 348 are provided between the first pad electrode 330 and the first chip mounting electrode 320. The first to third through holes 346, 347 and 348 suppress a first interference between the input and output terminals. It is also important that the fourth to sixth through holes 446, 447 and 448 are provided between the third pad electrode 430 and the second chip mounting electrode 420. The fourth to sixth through holes 446, 447 and 448 suppress a second interference between the input and output terminals.

Sixth Embodiment

Figure 10A:
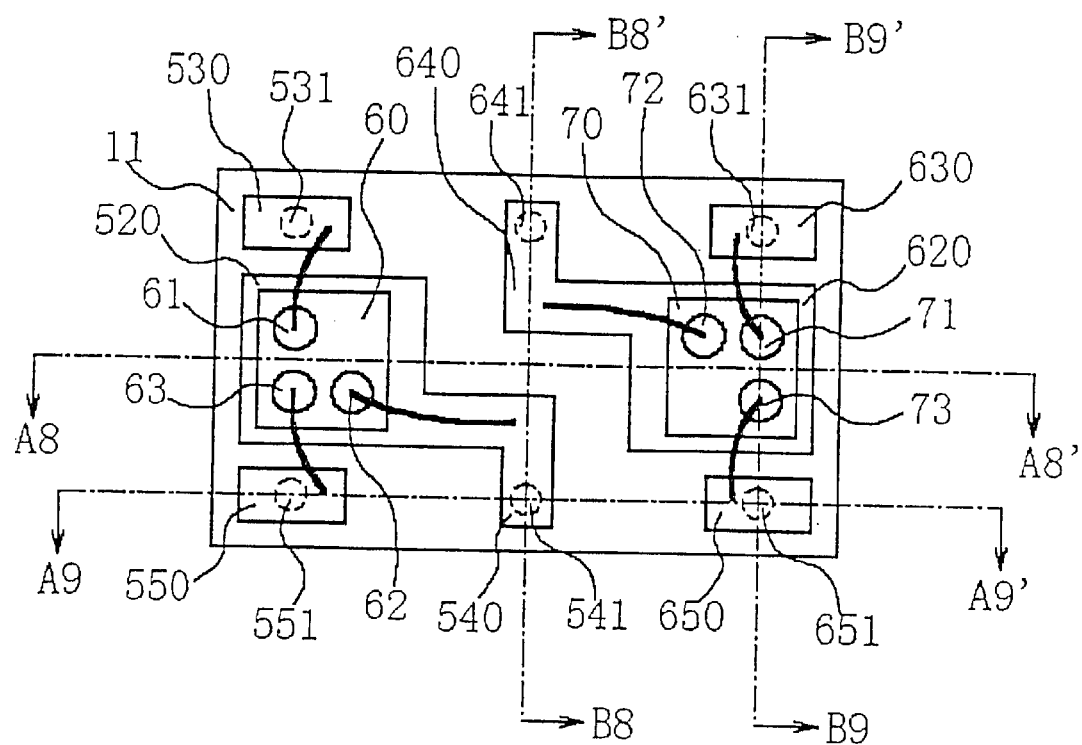
FIG. 10A is a plan view of a first main face of a mounting substrate of the lead-less semiconductor device in a sixth embodiment in accordance with the present invention.
Figure 10B:
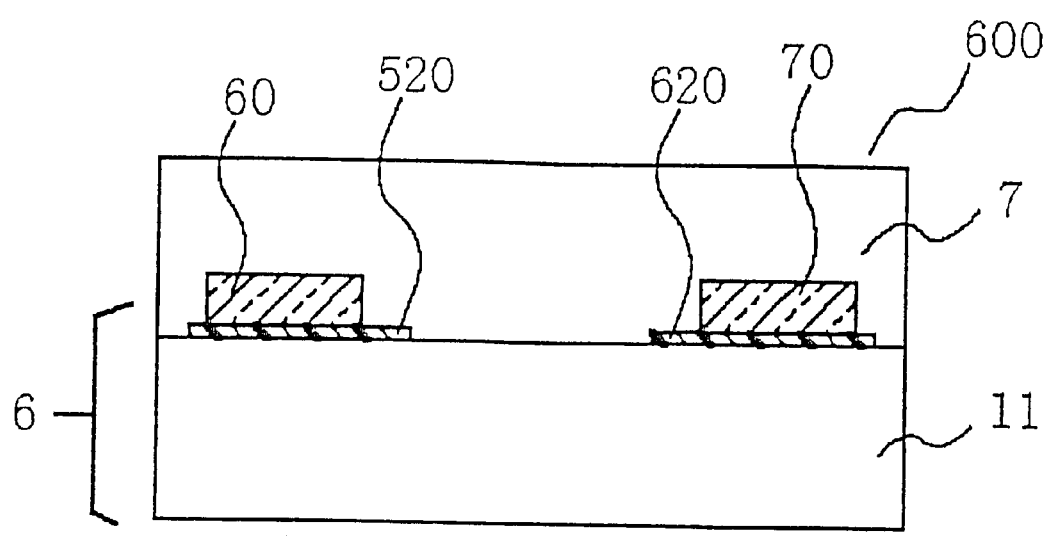
FIG. 10B is a cross sectional elevation view of the lead-less semiconductor device, taken along an A8–A8' line in FIG. 10A.
Figure 10C:
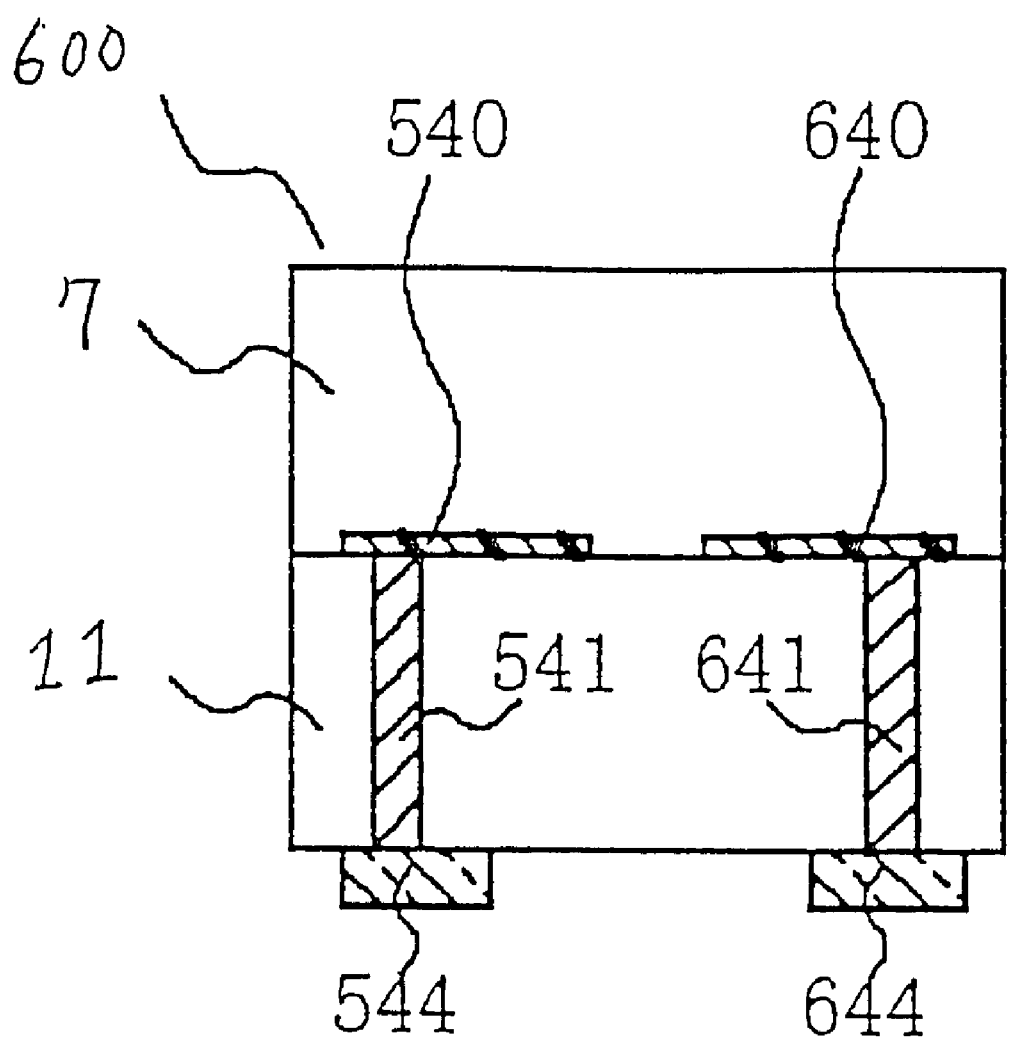
FIG. 10C is a cross sectional elevation view of the lead-less semiconductor device, taken along a B8–B8' line in FIG. 10A.
Figure 10D:
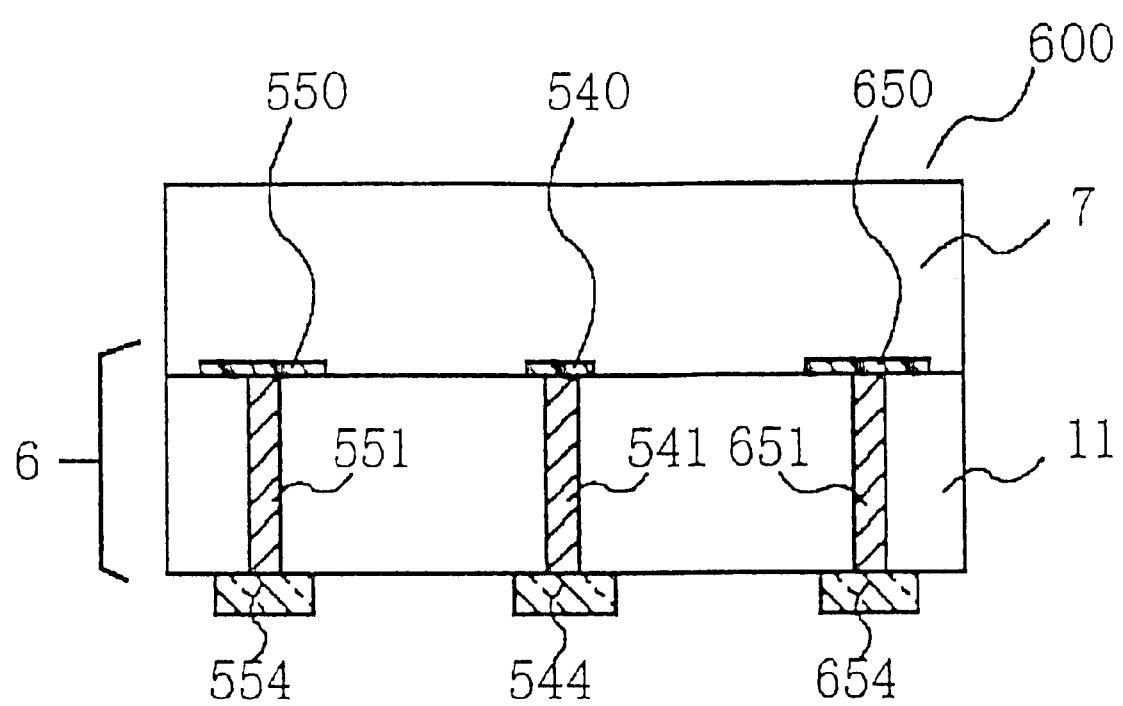
FIG. 10D is a cross sectional elevation view of the lead-less semiconductor device, taken along an A9–A9' line in FIG. 8A.
Figure 10E:
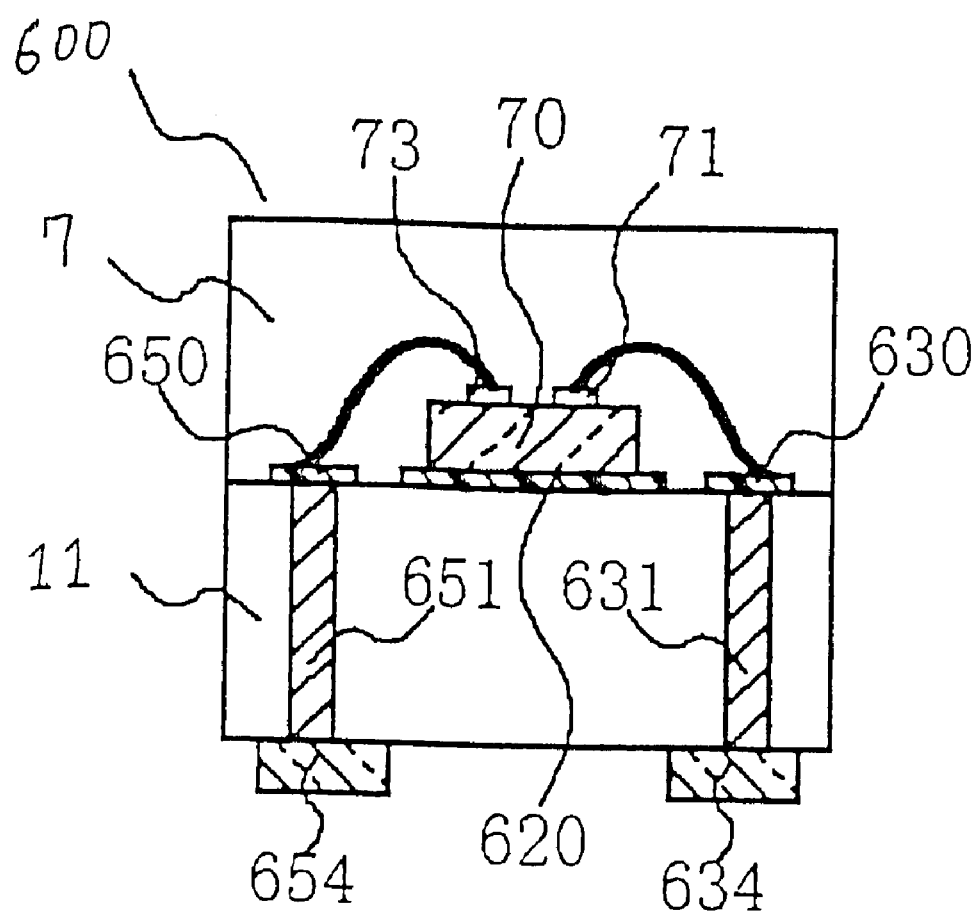
FIG. 10E is a cross sectional elevation view of the lead-less semiconductor device, taken along a B9–B9' line in FIG. 8A.

A sixth embodiment according to the present invention will be described in detail with reference to the drawings. FIG. 10A is a plan view of a first main face of a mounting substrate of the lead-less semiconductor device in a sixth embodiment in accordance with the present invention. FIG. 10B is a cross sectional elevation view of the lead-less semiconductor device, taken along an A8–A8' line in FIG. 10A. FIG. 10C is a cross sectional elevation view of the lead-less semiconductor device, taken along a B8–B8' line in FIG. 10A. FIG. 10D is a cross sectional elevation view of the lead-less semiconductor device, taken along an A9–A9' line in FIG. 8A. FIG. 10E is a cross sectional elevation view of the lead-less semiconductor device, taken along a B9–B9' line in FIG. 8A.

With reference to FIGS. 10A through 10E, a semiconductor device 600 has a mounting substrate 6 and a sealing resin 7. The mounting substrate 6 has a first main face which is adjacent to the sealing resin 7 and a second main face which is positioned opposite to the first main face. The mounting substrate 6 comprises a ceramic-base 11. On the first main face, first and second chip mounting electrodes 520 and 620 are provided for mounting first and second semiconductor chips 60 and 70, and also first and second pad electrodes 530 and 550 and third and fourth pad electrodes 630 and 650. A first set comprises the first chip mounting electrode 520 and the first and second pad electrodes 530 and 550. A second set comprises the second chip mounting electrode 620 and the third and fourth pad electrodes 630 and 650.

A first electrically conductive pattern 540 is provided on the first main face, wherein the first electrically conductive pattern 540 extends from the first chip mounting electrode 520 to an intermediate region between the second pad electrode 550 and the fourth pad electrode 650. The first electrically conductive pattern 540 is unitary formed with the first chip mounting electrode 520. The first electrically conductive pattern 540 is electrically connected with the first chip mounting electrode 520. The first chip mounting electrode 520 is positioned between the first and second pad electrodes 530 and 550.

A second electrically conductive pattern 640 is provided on the first main face, wherein the second electrically conductive pattern 640 extends from the second chip mounting electrode 620 to an intermediate region between the first pad electrode 530 and the third pad electrode 630. The second electrically conductive pattern 640 is unitary formed with the second chip mounting electrode 620. The second electrically conductive pattern 640 is electrically connected with the second chip mounting electrode 620. The second chip mounting electrode 620 is positioned between the third and fourth pad electrodes 630 and 650.

On the second main face, first, second and third terminal electrodes 534, 544 and 554 and fourth, fifth and sixth terminal electrodes 634, 644 and 654 are provided for external connections. The first terminal electrode 534 is connected through a first via hole 531 to the first pad electrode 530. The second terminal electrode 544 is connected through a second via hole 541 to the first electrically conductive pattern 540 extending from the first chip mounting electrode 520. The third terminal electrode 554 is connected through a third via hole 551 to the second pad electrode 550. The fourth terminal electrode 634 is connected through a fourth via hole 631 to the third pad electrode 630. The fifth terminal electrode 644 is connected through a fifth via hole 641 to the second electrically conductive pattern 640 extending from the second chip mounting electrode 620. The sixth terminal electrode 654 is connected through a sixth via hole 651 to the fourth pad electrode 650.

The first semiconductor chip 60 mounted on the first chip mounting electrode 520 has a first electrode 61 connected through a first metal bonding wire 8-1 to the first pad electrode 530, a second electrode 62 connected through a second metal bonding wire 8-2 to the first electrically conductive pattern 540 connected with the first chip mounting electrode 520, and a third electrode 63 connected through a third metal bonding wire 8-3 to the second pad electrode 550. The second semiconductor chip 70 mounted on the second chip mounting electrode 620 has a first electrode 71 connected through a fourth metal bonding wire 8-4 to the third pad electrode 630, a second electrode 72 connected through a fifth metal bonding wire 8-5 to the second electrically conductive pattern 640 connected with the second chip mounting electrode 620, and a third electrode 73 connected through a sixth metal bonding wire 8-6 to the fourth pad electrode 650.

As described above, it is important that the first chip mounting electrode 520 having the ground potential is provided between the first pad electrode 530 and the second pad electrode 550 as the input and output electrodes. The first chip mounting electrode 520 having the ground potential reduces a first capacitance between the input and output electrodes.

It is important that the second chip mounting electrode 620 having the ground potential is provided between the third pad electrode 630 and the fourth pad electrode 650 as the input and output electrodes. The second chip mounting electrode 620 having the ground potential reduces a second capacitance between the input and output electrodes.

Seventh Embodiment

Figure 11A:
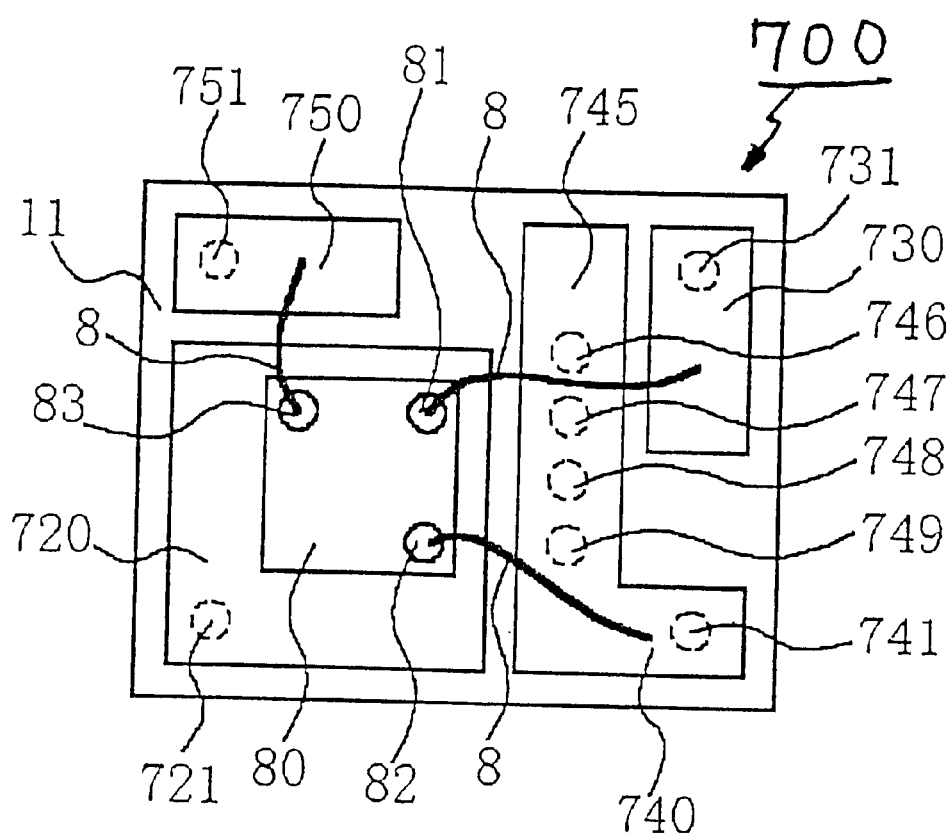
FIG. 11A is a plan view of a first main face of a mounting substrate of the lead-less semiconductor device in a seventh embodiment in accordance with the present invention.
Figure 11B:
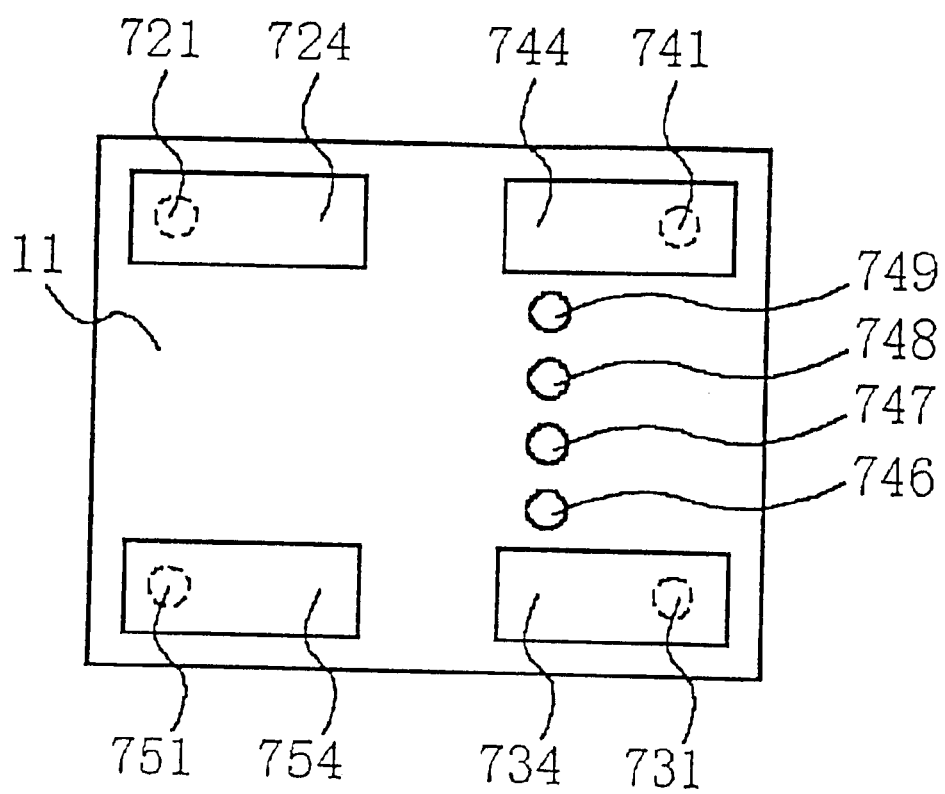
FIG. 11B is a plan view of a second main face of the mounting substrate of the lead-less semiconductor device of FIG. 11A.

A seventh embodiment according to the present invention will be described in detail with reference to the drawings. FIG. 11A is a plan view of a first main face of a mounting substrate of the lead-less semiconductor device in a seventh embodiment in accordance with the present invention. FIG. 11B is a plan view of a second main face of the mounting substrate of the lead-less semiconductor device of FIG. 11A.

With reference to FIGS. 11A and 11B, a semiconductor device 700 has a mounting substrate and a sealing resin 7. The mounting substrate has a first main face which is adjacent to the sealing resin 7 and a second main face which is positioned opposite to the first main face. The mounting substrate comprises a ceramic-base 11. On the first main face, a chip mounting electrode 720 is provided for mounting a semiconductor chip 80, and also first, second and third pad electrodes 730, 740 and 750. The second and third pad electrodes 740 and 750 are the ground electrodes. The chip mounting electrode 720 and the first pad electrode 730 are the input and output electrodes.

On the second main face, first, second, third and fourth terminal electrodes 724, 734, 744 and 754 are provided for external connections. The first terminal electrode 724 is connected through a first via hole 721 to the chip mounting electrode 720. The second terminal electrode 734 is connected through a second via hole 731 to the first pad electrode 730. The third terminal electrode 744 is connected through a third via hole 741 to the second pad electrode 740. The fourth terminal electrode 754 is connected through a fourth via hole 751 to the third pad electrode 750. The semiconductor chip 80 has a first electrode 81 connected through a first metal bonding wire 8-1 to the first pad electrode 730, a second electrode 82 connected through a second metal bonding wire 8-2 to the second pad electrode 740 and a third electrode 83 connected through a third metal bonding wire 8-3 to the third pad electrode 750.

An electrically conductive pattern 745 is provided on the first main face, wherein the electrically conductive pattern 745 extends from the second pad electrode 740 to a region between the first pad electrode 730 and the chip mounting electrode 720 as the input and output electrodes. The electrically conductive pattern 745 is unitary formed with the second pad electrode 740. The electrically conductive pattern 745 is electrically connected with the second pad electrode 740, which is further electrically connected through the fourth via hole 741 to the third pad electrode 744 on the second main face.

Further, first to fourth through holes 746, 747, 748 and 749 are provided in the ceramic base 11, so that the first to fourth through holes 746, 747, 748 and 749 are in contact with the electrically conductive pattern 745. The first to fourth through holes 746, 747, 748 and 749 are positioned between the first pad electrode 730 and the chip mounting electrode 720.

For the present invention, it is important that the electrically conductive pattern 745 having the ground potential is provided between the first electrode pad 730 and the chip mounting electrode 720 as the input and output electrodes. The electrically conductive pattern 745 is united with the second pad electrode 740 having the ground potential. The electrically conductive pattern 745 having the ground potential reduces a capacitance between the first electrode pad 730 and the chip mounting electrode 720 as the input and output electrodes as compared to when the electrically conductive pattern 745 is not provided.

For the present invention, it is also important that the first to fourth through holes 746, 747, 748 and 749 are provided between the first electrode pad 730 and the chip mounting electrode 720 as the input and output electrodes. The first to fourth through holes 746, 747, 748 and 749 suppress the interference between the input and output terminals.

As a modification to the above seventh embodiment, it is important that the electrically conductive pattern 745 extends from the third pad electrode 750 to the region between the first electrode pad 730 and the chip mounting electrode 720 as the input and output electrodes. The electrically conductive pattern 745 is united with the third pad electrode 750 having the ground potential. The electrically conductive pattern 745 having the ground potential also reduces a capacitance between the first electrode pad 730 and the chip mounting electrode 720 as the input and output electrodes as compared to when the electrically conductive pattern 745 is not provided.

In the above first to seventh embodiments, the substrate comprises a ceramic substrate. It is, of course, possible to use any other insulating substrate.

In the above first to seventh embodiments, the electrically conductive pattern is unitary formed with the ground potential electrode. It is, of course, possible that the electrically conductive pattern is not unitary formed with but electrically connected to the ground potential electrode, so that the electrically conductive pattern has the ground potential.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A semiconductor device comprising:

an insulating substrate have a first main face which is sealed with a sealing material;

at least a set of input and output electrode patterns provided on said first main face, and said input and output electrode patterns being separated from each other;

at least a ground electrode pattern having a ground potential, and said ground electrode pattern being separated from said input and output electrode patterns;

at least an electrically conductive pattern extending over an inter-region between said input and output electrode patterns, and said electrically conductive pattern being separated from said input and output electrode patterns, and said electrically conductive pattern being electrically connected to said ground electrode pattern, so that said electrically conductive pattern has a ground potential; and a plurality of through holes filled with an electrically conductive material, and said through holes being in contact with said electrically conductive pattern and being positioned between via holes connected with said input and output electrode patterns.

2. The device as claimed in claim 1, wherein said ground electrode pattern comprises a chip mounting electrode, on which a semiconductor chip is mounted.

3. The semiconductor device as claimed in claim 1, further comprising a bonding wire connecting said pair of input and output electrode patterns to one another, said bonding wire crossing over said at least one electrically conductive pattern and not crossing over any of said plurality of input and output electrode patterns other than the connected pair of input and output electrode patterns.

* * * * *